(12) United States Patent
Lue et al.

(10) Patent No.: US 9,287,406 B2
(45) Date of Patent: Mar. 15, 2016

(54) DUAL-MODE TRANSISTOR DEVICES AND METHODS FOR OPERATING SAME

(71) Applicant: Macronix International Co., Ltd., Hsinchu (TW)

(72) Inventors: Hang-Ting Lue, Hsinchu (TW); Wei-Chen Chen, Luzhu Township (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/163,639

(22) Filed: Jan. 24, 2014

(65) Prior Publication Data
US 2014/0361369 A1     Dec. 11, 2014

Related U.S. Application Data

(60) Provisional application No. 61/831,630, filed on Jun. 6, 2013.

(51) Int. Cl.
*H01L 29/786* (2006.01)
*H01L 29/66* (2006.01)
*H01L 29/739* (2006.01)
*H01L 29/423* (2006.01)
*H01L 27/092* (2006.01)
(Continued)

(52) U.S. Cl.
CPC .......... *H01L 29/78645* (2013.01); *G11C 16/12* (2013.01); *G11C 16/14* (2013.01); *G11C 16/26* (2013.01); *H01L 27/092* (2013.01); *H01L 27/11568* (2013.01); *H01L 29/4232* (2013.01); *H01L 29/66484* (2013.01); *H01L 29/7391* (2013.01)

(58) Field of Classification Search
CPC ............... H01L 29/78645; H01L 29/66484; H01L 29/7831; H01L 29/8124; H01L 2924/13081; H01L 2924/13085
See application file for complete search history.

(56) References Cited

U.S. PATENT DOCUMENTS 5,124,769 A   *   6/1992   Tanaka et al. ............... 257/66
5,918,125 A       6/1999   Guo et al.
(Continued)

FOREIGN PATENT DOCUMENTS

WO        2012116528 A1    9/2012

OTHER PUBLICATIONS

EP Search Report from family member EP14153020, Jan. 20, 2015, 4 pages.
(Continued)

*Primary Examiner* — Kevin Parendo
(74) *Attorney, Agent, or Firm* — Haynes Beffel & Wolfeld LLP

(57) ABSTRACT

A dual-mode transistor structure comprises a semiconductor body. The semiconductor body of the device includes a channel region, a p-type terminal region (operable as a source or drain) adjacent a first side of the channel region and an n-type terminal region (operable as a source or drain) adjacent a second side of the channel region. A gate insulator is disposed on a surface of the semiconductor body over the channel region. A gate is disposed on the gate insulator over the channel region. A first assist gate is disposed on a first side of the gate, and a second assist gate is disposed on a second side of the gate. Optionally, a back gate can be included beneath the channel region. Biasing the assist gates can be used to select n-channel or p-channel modes in a single device.

16 Claims, 21 Drawing Sheets

(51) Int. Cl.
*G11C 16/12* (2006.01)
*G11C 16/14* (2006.01)
*G11C 16/26* (2006.01)
*H01L 27/115* (2006.01)

(56) References Cited

U.S. PATENT DOCUMENTS

| | | | |
|---|---|---|---|
| 8,208,279 B2 | 6/2012 | Lue | |
| 8,363,476 B2 | 1/2013 | Lue et al. | |
| 8,503,213 B2 | 8/2013 | Chen et al. | |
| 2007/0252212 A1 | 11/2007 | Onsongo et al. | |
| 2009/0026553 A1* | 1/2009 | Bhuwalka et al. | 257/402 |
| 2009/0096028 A1 | 4/2009 | Le Royer et al. | |
| 2010/0032713 A1* | 2/2010 | Kawahara et al. | 257/141 |
| 2011/0171792 A1* | 7/2011 | Chang et al. | 438/157 |
| 2011/0303961 A1* | 12/2011 | Chang et al. | 257/316 |
| 2012/0051137 A1 | 3/2012 | Hung et al. | |
| 2012/0068241 A1 | 3/2012 | Sakuma et al. | |
| 2012/0069259 A1* | 3/2012 | Oh et al. | 349/43 |
| 2012/0087460 A1* | 4/2012 | Moriwaki | 377/64 |
| 2012/0168869 A1* | 7/2012 | Hikida | 257/365 |
| 2012/0228691 A1* | 9/2012 | Dunga et al. | 257/315 |
| 2013/0021061 A1 | 1/2013 | Bjoerk et al. | |

OTHER PUBLICATIONS

Cheung, Kin P., "On the 60 mV/dec @300 K Limit for MOSFET Subthreshold Swing", VLSI Technology Systems and Applications (VLSI-TSA), 2010 International Symposium on, Apr. 26-28, 2010, pp. 72-73.

Lue et al., "A Novel Dual-Channel 3D NAND Flash Featuring both N-Channel and P-Channel NAND Characteristics for Bit-alterable Flash Memory and a New Opportunity in Sensing the Stored Charge in the WL Space", 2013 IEEE IEDM, Dec. 9-11, 2013, pp. 3.7.1-3.7.4.

Muller et al., "Subthreshold swings below 60 mV/dec in three-terminal nanojunctions at room temerature," Applied Physics Letters 101, Sep. 27, 2012, pp. 133504-1 through 133504-4.

U.S. Appl. No. 13/936,729, entitled "Array Arrangement Including Carrier Source", filed Jul. 8, 2013, 60 pages.

* cited by examiner

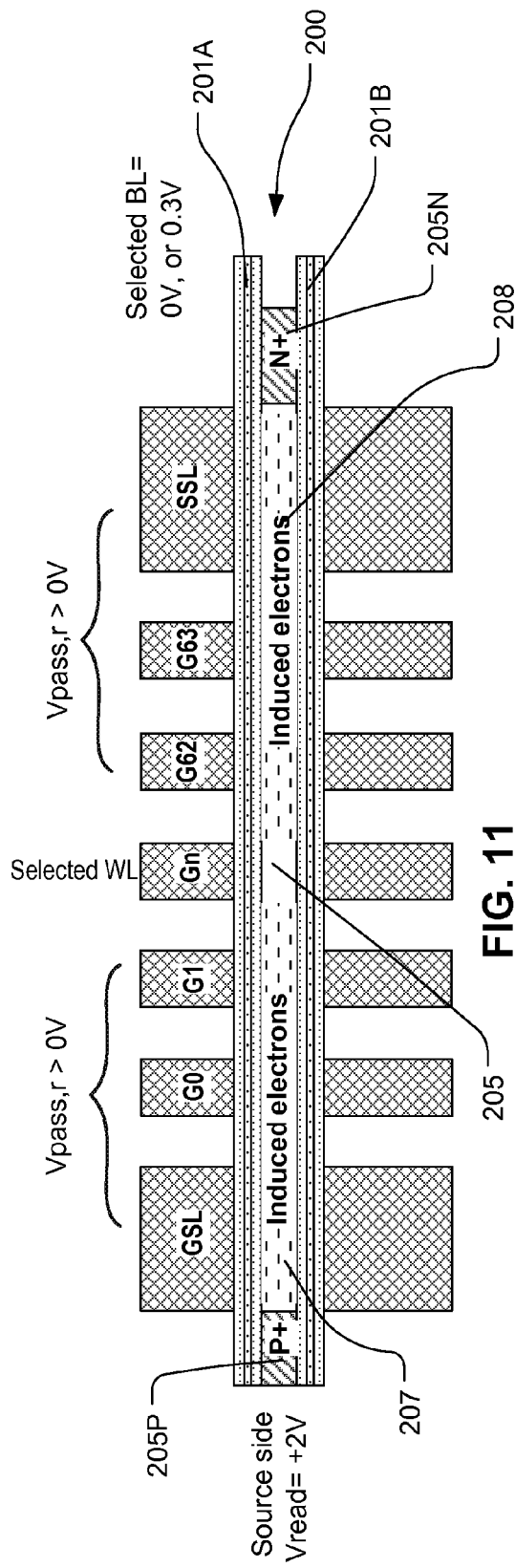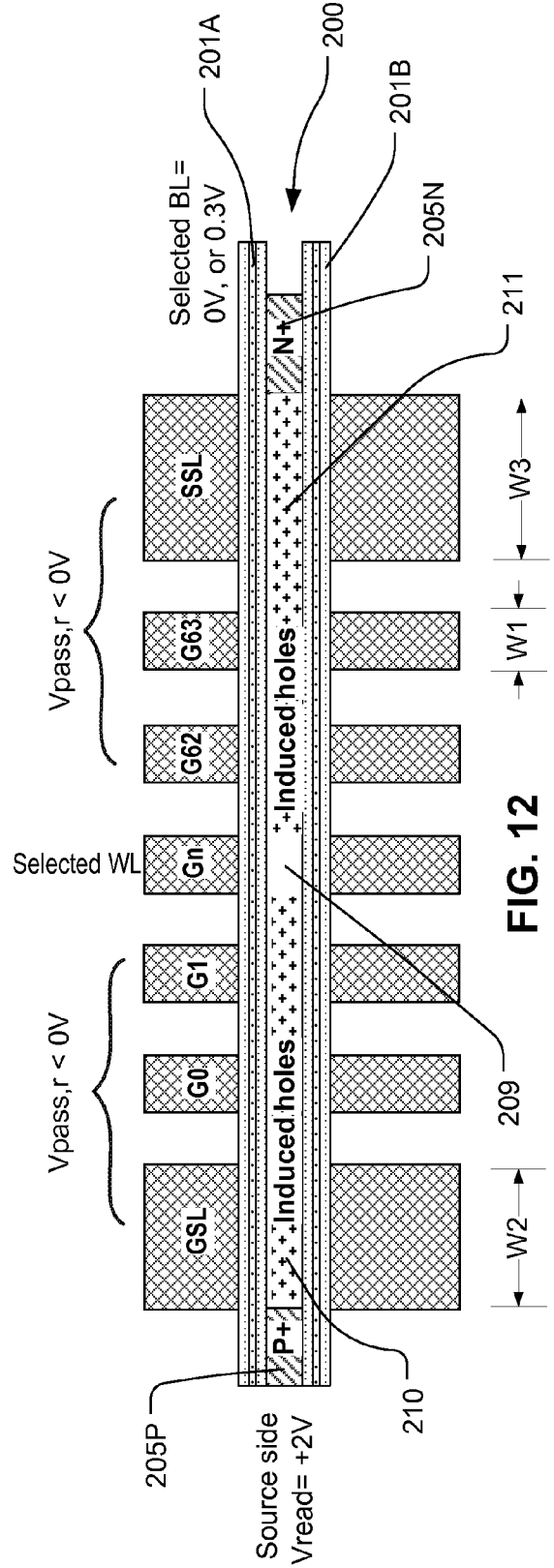

DUAL-MODE TRANSISTOR DEVICES AND METHODS FOR OPERATING SAME

Benefit of U.S. Provisional Patent Application No. 61/831,630, filed 6 Jun. 2013, entitled "Operation Methods for Dual-Channel 3D NAND Flash," is hereby claimed.

BACKGROUND

1. Field of the Invention

The present invention relates to transistor structures, to memory structures and to methods of operating the same.

2. Description of Related Art

In integrated circuit design, it is desirable to utilize transistors that have fast transitions between on and off states, and low leakage current. One parameter associated with transition time and leakage current for CMOS transistors is known as subthreshold slope, which is often characterized in millivolts of gate voltage per decade of drain current, where a "decade" corresponds to a 10 times increase in drain current. It is believed that the subthreshold slope for CMOS transistors cannot be better than about 60 mV/decade at room temperature.

In the CMOS designs, transistors are included that are configured for n-channel mode (when the channel is on, electrons are charge carriers), and other transistors are included that are configured for p-channel mode (when the channel is on, holes are charge carriers). The n-channel or p-channel mode is set by the structure of the transistor. This can limit flexibility in the layout of an integrated circuit, and in the implementation of circuitry utilizing the transistors.

Thus it is desirable to provide transistor structures that address limitations of prior designs.

Leakage current and transition times are also important parameters in the design of high density memory. Also, in charge trapping memory cells based on MOS transistor-like structures, it can be necessary to provide both types of charge carrier in the channel of a memory cell for the purposes of program or erase operations.

Further limitations in many types of prior art flash memory technologies relate to the requirement for block erase operations. Because of the reliance on block erase, the complexity of the required operations and the amount of required time for writing data in random addresses of the flash memory are increased.

It is desirable therefore, in addition, to provide memory structures that support more efficient operation and low leakage.

SUMMARY

A dual-mode transistor structure is described, capable of acting in a p-channel mode and in an n-channel mode in response to a control signal. Also, the dual-mode transistor structure can be operated with very steep subthreshold slope, resulting in fast transition times and low leakage.

A device is described that comprises a semiconductor body, which can be a semiconductor strip isolated from a substrate by an insulator, such as a silicon-on-insulator (SOI) structure. The semiconductor body of the device includes a channel region, a p-type terminal region (operable as a source or drain) adjacent a first side of the channel region and an n-type terminal region (operable as a source or drain) adjacent a second side of the channel region. A gate insulator is disposed on a surface of the semiconductor body over the channel region. A gate is disposed on the gate insulator over the channel region. Also, an assist gate structure is disposed on the gate insulator. The assist gate structure includes a first assist gate on a first side of the gate overlying a portion of the channel region adjacent the p-type terminal region, and a second assist gate on a second side of the gate overlying a portion of the channel region adjacent the n-type terminal region. Optionally, a back gate can be included beneath the channel region.

In one example, the semiconductor body comprises a plurality of fins in the channel region which can terminate in pads in which the p-type terminal region and n-type terminal region are disposed.

Control circuitry can be provided to apply bias conditions that control operation of the device. The bias conditions can include voltages applied to the assist gates to select p-channel and n-channel mode. For p-channel mode, negative voltages are applied to the assist gates, inducing a population of holes beneath the assist gates to support p-channel mode. For n-channel mode, positive voltages are applied to the assist gates inducing a population of electrons beneath the assist gates to support n-channel mode.

A plurality of dual-mode transistor structures can be configured into circuits on an integrated circuit, and controlled selectively for p-channel and n-channel mode. In some circuits, the dual-mode transistor structures can be dynamically switched between p-channel and n-channel mode in support of the mission functions of the circuits.

BRIEF DESCRIPTION OF THE DRAWINGS

FIG. 11 illustrates an embodiment of a NAND string configured for dual-mode operation, biased for n-channel mode.

FIG. 12 illustrates an embodiment of a NAND string configured for dual-mode operation, biased for p-channel mode.

DETAILED DESCRIPTION

A detailed description is provided with reference to the FIGS. 1-31.

Figure 1:
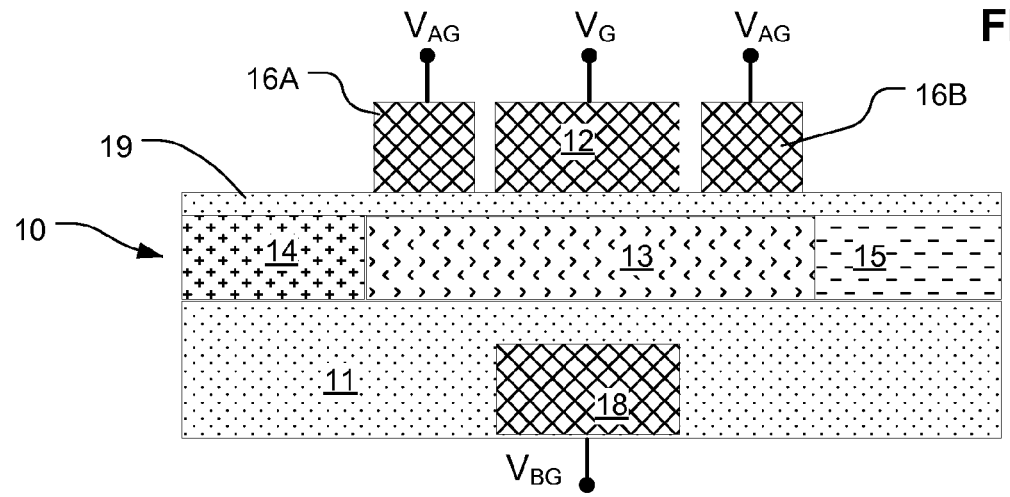
FIG. 1 illustrates a transistor structure having a dual-mode channel as described herein.

FIG. 1 is a cross-section of a dual-mode transistor structure taken along the channel length dimension. The transistor structure includes a semiconductor body 10 that has a channel region 13, a first terminal region 14 having p-type doping and a second terminal region 15 having n-type doping. In the channel region 13, the semiconductor body can be undoped, or have a doping profile that is configured for a channel according to a particular application of the device. It can be preferred for some applications that the channel region 13 be configured for fully depleted operation, such as by having a width that is less than the maximum depletion width. The semiconductor body 10 is disposed on an insulator 11. The structure can comprise a silicon-on-insulator SOI substrate.

A gate structure 12 overlies the channel region 13 of the semiconductor body 10. A first assist gate 16A is disposed on a first side of the gate 12 and overlies a first portion of the channel region 13 adjacent to the p-type, first terminal region 14. A second assist gate 16B is disposed on a second side of the gate 12 and overlies a second portion of the channel region 13 adjacent to the n-type, second terminal region 15.

In some embodiments, one or both of the first assist gate 16A and the second assist gate 16B can also overlie a portion of the corresponding first terminal region 14 and second terminal region 15. It is desirable that the spacing between the first assist gate 16A and the gate 12, and the spacing between the second assist gate 16B and the gate 12 be relatively small relative to the length of the channel region 13.

In the embodiment illustrated, a conductive back gate element 18 is disposed within the insulator 11 and can be utilized in combination with the gate 12 and the assist gates 16A, 16B to control operation of the channel region 13. For example, a bias voltage on the back gate element 18 can be used to control threshold voltage of the transistor structure in both p-channel mode and n-channel mode. In other embodiments, the back gate element 18 is omitted.

As represented by the labels $V_{AG1}$, $V_G$, $V_{AG2}$, and $V_{BG}$, bias circuitry can be utilized with the structure to apply signals independently to the gate 12, to the assist gates 16A and 16B and to the back gate element 18. In some embodiments, the assist gates 16A and 16B may be portions of a single assist gate structure, and receive substantially the same bias voltage in all operating modes. In other embodiments, the assist gates 16A and 16B may be separate, and be coupled separately to bias circuitry to manage operating characteristics of the device.

Figure 2:
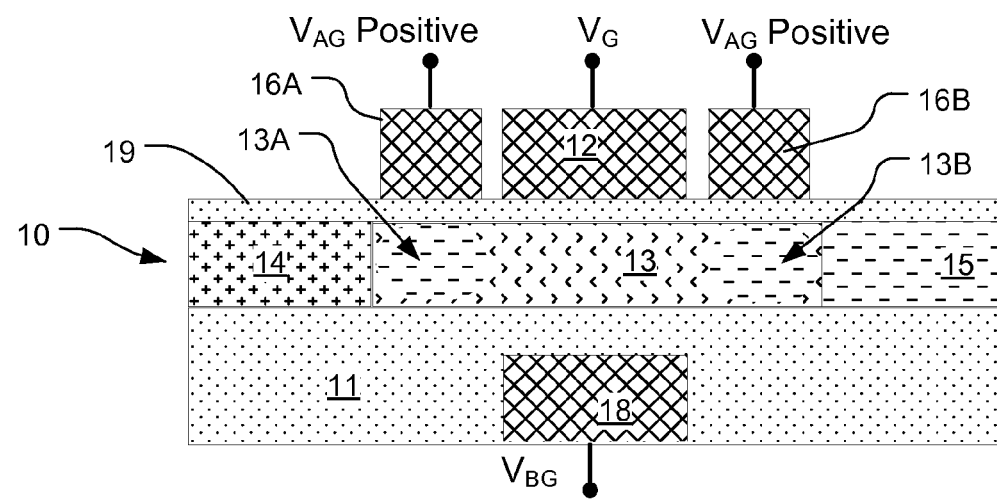
FIG. 2 illustrates the transistor structure of FIG. 1, biased for n-channel mode operation.

FIG. 2 represents the structure of FIG. 1, having bias voltages on the assist gates 16A and 16B to induce n-channel mode. In order to bias the dual-mode structure for n-channel mode, bias voltages on the assist gates 16A and 16B are positive. This has the effect of attracting n-type carriers or electrons into the channel region 13 of the transistor structure beneath the assist gates 16A and 16B, as schematically represented by "−" symbols in regions 13A and 13B.

Figure 3:
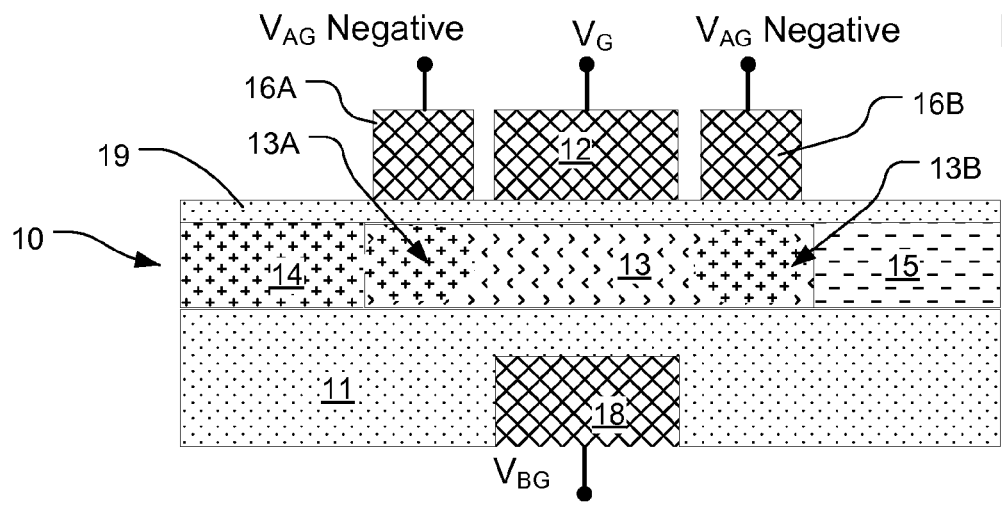
FIG. 3 illustrates the transistor structure of FIG. 1, biased for p-channel mode operation.

FIG. 3 represents the structure of FIG. 1, having bias voltages on the assist gates 16A and 16B to induce p-channel mode. In order to bias the dual-mode structure for p-channel mode, bias voltages on the assist gates 16A and 16B are negative. This has the effect of attracting p-type carriers or holes into the channel region 13 beneath the assist gates 16A and 16B, as schematically represented by "+" symbols in regions 13A and 13B.

The dual-mode transistor structure shown in FIG. 1 has excellent on/off characteristics with very small junction leakage current in both modes. Moreover, it is possible to implement the device with a super steep subthreshold slope, less than 60 mV per decade at room temperature.

By controlling the bias voltage on the assist gates 16A and 16B, it is possible to switch the dual-mode transistor structure between n-channel and p-channel modes. This can be done dynamically, in the sense that mode switching can be induced during operation of the circuitry deploying the devices. Switching between n-channel and p-channel mode during operation of the circuitry deploying the devices can be characterized as dynamic channel mode switching. Also, the mode can be set statically, using volatile and non-volatile configuration codes, fuses, anti-fuses, and the like.

A plurality of dual-mode transistor structures can be configured into circuits which perform logic functions, including for example AND gates, NAND gates, OR gates and NOR gates, exclusive-OR gates, and exclusive-NOR gates. An array of dual-mode transistor structures can be coupled with programmable interconnect structures on an integrated circuit which can be used to configure individual structures or groups of structures for n-channel and p-channel mode.

Figure 4:
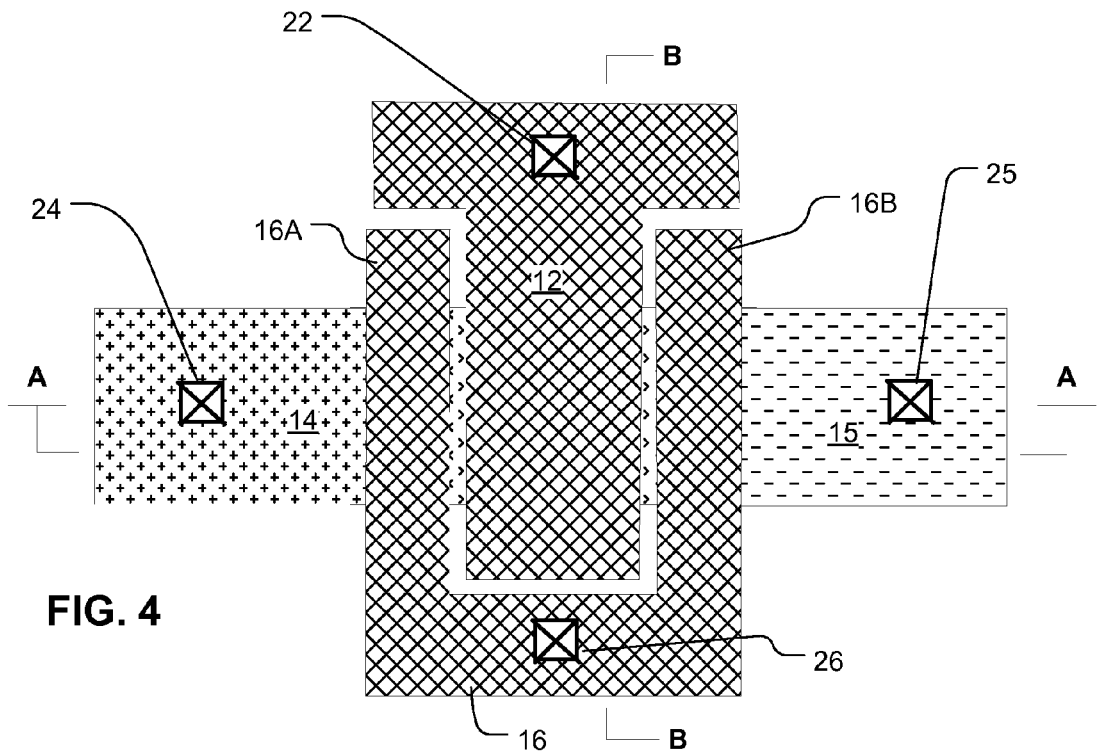
FIG. 4 is a plan view diagram of an embodiment of a transistor structure having a dual-mode channel.

FIG. 4 is a plan view of an embodiment of a dual-mode transistor structure as described herein. In this embodiment, the semiconductor body includes a channel region (obscured by the gate 12 and the assist gate structure 16B/16B), a p-type first terminal region 14 (e.g., P+) and an n-type second terminal region 15 (e.g., N+). Contacts 24 and 25 are located in the p-type and n-type terminal regions 14, 15, respectively. The gate 12 is "T" shaped with a contact 22 located in the broad portion of the structure. The assist gate structure 16, 16A, 16B is "U" shaped with a contact 26 located in the connecting portion 16 of the assist gate structure. Although not illustrated in FIG. 4, a thin insulator spacer is disposed between the gate 12 and the assist gate structure 16, 16A, 16B.

Figure 4A:
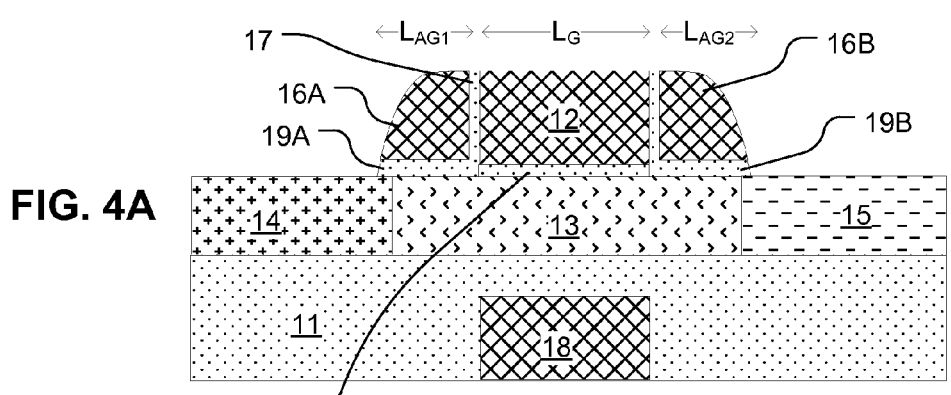
FIG. 4A is a cross-section diagram of an embodiment of a transistor structure having a dual-mode channel, taken on line A-A of FIG. 4.

FIG. 4A is a cross-section of the structure of FIG. 4 taken along the line A-A. The elements in FIG. 4A that correspond with those in FIG. 1 are given like reference numerals. In this example, the thickness of the gate insulator 19 in region 19A beneath the assist gate 16A and in region 19B beneath assist gate 16B is slightly thicker than it is beneath the gate 12. Also, a spacer insulator 17, such as silicon oxide, is disposed between the assist gate 16A and gate 12, and between the assist gate 16B and the gate 12. The assist gates can be patterned using a self-aligned polysilicon spacer technique, which can result in the rounded corner profile illustrated in FIG. 4A. Alternatively, the assist gates can be patterned using lithographic patterning, or using other patterning technologies, as suits the design being implemented. Also, the gate and the assist gates can be conductive materials other than polysilicon, including metals, other doped semiconductors, multilayer structures and so on, as desired for the particular implementation.

As shown in FIG. 4A, the channel length dimension for the structure can be approximated by the combination of the length $L_G$ of the gate 12, and the lengths $L_{AG1}$, $L_{AG2}$ of the assist gates 16A and 16B.

Figure 4B:
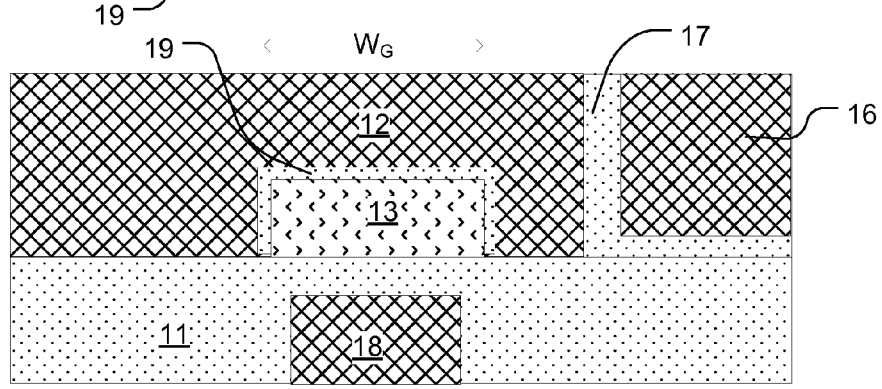
FIG. 4B is a cross-section diagram of an embodiment of a transistor structure having a dual-mode channel, taken on line B-B of FIG. 4.

FIG. 4B is a cross-section of the structure of FIG. 4 taken along the line B-B. The elements of FIG. 4B that correspond with those in FIG. 4A are given like reference numerals. The channel width dimension for the structure can be approximated by the width $W_G$ of the semiconductor body in the channel region 13.

Figure 5:
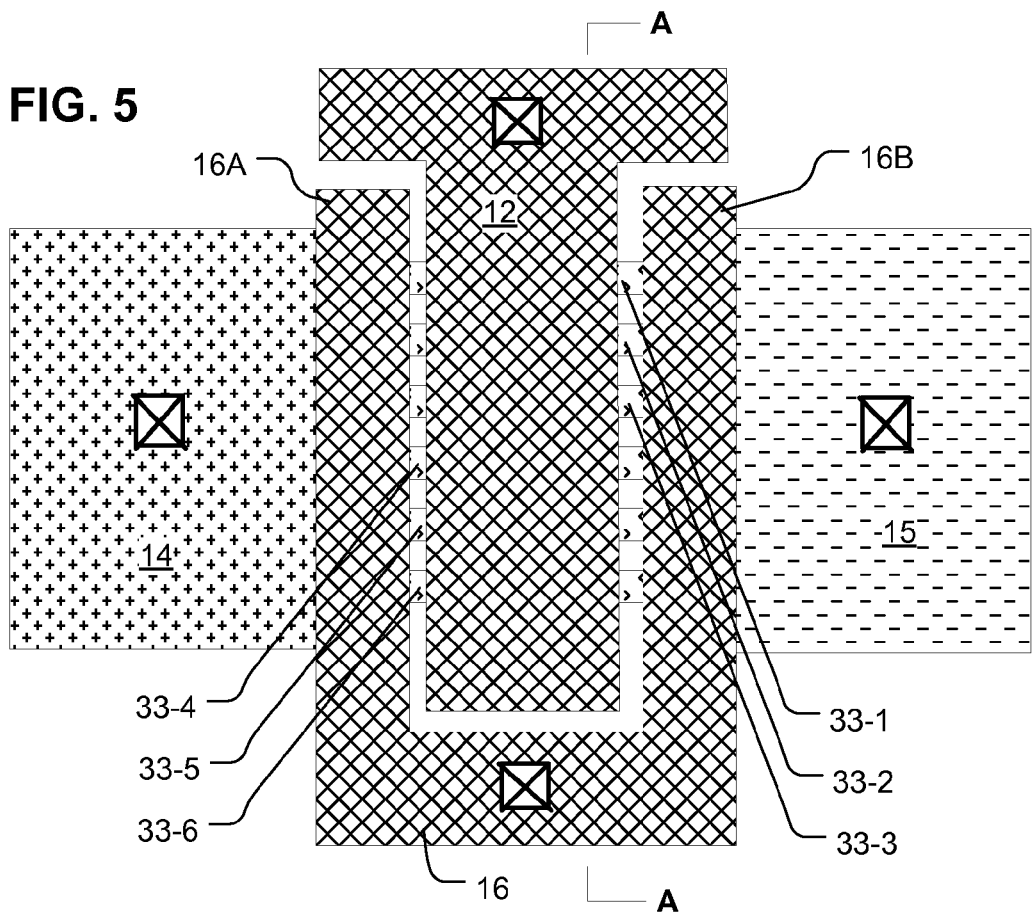
FIG. 5 is a plan view diagram of an embodiment of a transistor structure including a plurality of fins, and having a dual-mode channel.

FIG. 5 is a plan view diagram of a dual-mode transistor structure which comprises a plurality of fins 33-1 through 33-6 in the channel region of the semiconductor body. Components of FIG. 5A which are also shown in FIG. 4 are given the same reference numerals. As with the embodiment of FIG. 4, the semiconductor body includes a p-type first terminal region 14, and an n-type second terminal region 15. The plurality of fins 33-1 through 33-6 in the semiconductor body extend between first terminal region 14 and second terminal region 15 in this example.

Figure 5A:
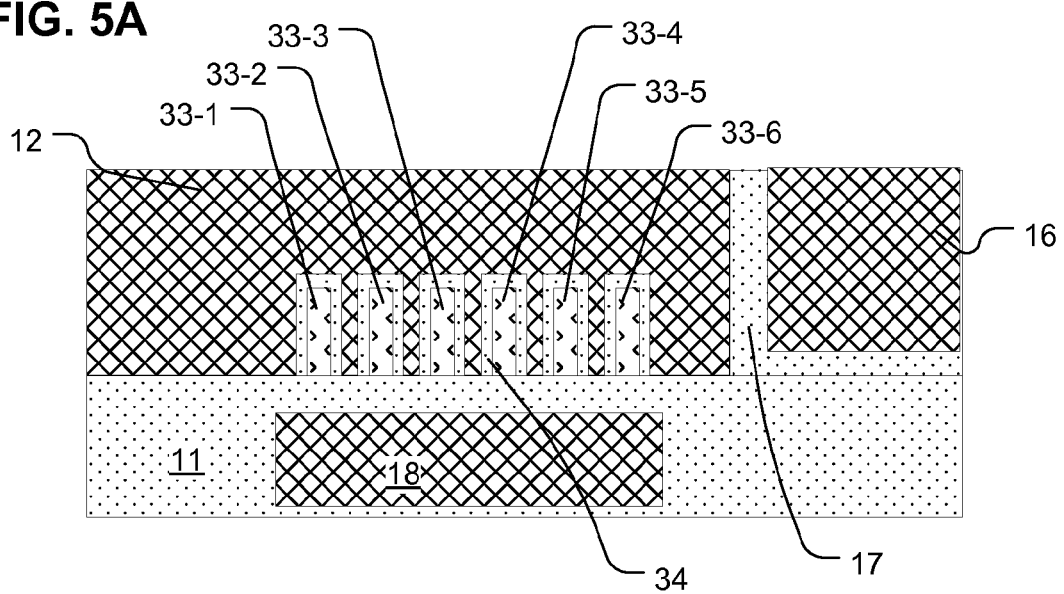
FIG. 5A is a cross-section diagram of an embodiment of a transistor structure including a plurality of fins, taken on line A-A of FIG. 5.

FIG. 5A is a cross-section view of the structure of FIG. 5 taken along the line A-A. As illustrated, the gate structure 12 overlies the plurality of fins 33-1 through 33-6 in the fin-type semiconductor body as shown. A back gate element 18 is optional.

A method of manufacturing a dual-mode transistor device includes forming a semiconductor body including a channel region, a p-type terminal region adjacent a first side of the channel region and an n-type terminal region adjacent a second side of the channel region; forming a gate insulator on a surface of the semiconductor body over the channel region; forming a gate on the gate insulator over the channel region; and forming a first assist gate on the gate insulator disposed on a first side of the gate overlying a portion of the channel region adjacent to the p-type terminal region, and a second assist gate on the gate insulator disposed on a second side of the gate overlying a portion of the channel region adjacent to the n-type terminal region.

In some embodiments, the method includes forming the semiconductor body on an insulating layer on a substrate, and wherein the semiconductor body is isolated from the substrate by the insulating layer. Also, the method can include forming a back gate underlying the channel region in the insulating layer.

The method can also include forming the first assist gate electrically connected to the second assist gate.

The method can include patterning a plurality of fins in the channel region of the semiconductor body.

Also, the method can include providing circuitry coupled to the assist gates in the plurality of transistor structures which applies positive voltages to the first and second assist gates of some of the transistor structures for n-channel mode, and negative voltages to the first and second assist gates of others of the transistor structures for p-channel mode.

Figure 6:
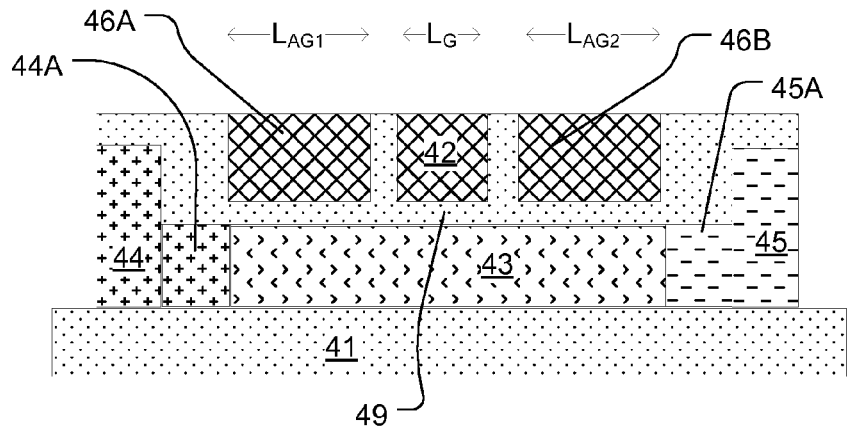
FIG. 6 is a cross-section diagram of an embodiment of a dual-mode transistor structure used for simulations of the operation of such devices.

FIG. 6 is a diagram of a dual-mode transistor structure, utilized for the purposes of describing a simulated structure. In the simulated structure, the substrate includes insulating layer 41, which for the purposes of the simulation is about 30 nm thick. The semiconductor body includes fin-type channel region 43 that comprises silicon about 10 nm wide with a fin height about 20 nm. A heavily doped p-type first terminal region 44, and a more lightly doped p-type region 44A, are disposed on one side of the channel region 43. A heavily doped n-type second terminal region 45, and a more lightly doped n-type region 45A, are disposed on the other side of the channel region 43. The more heavily doped regions 44, 45 have a height of 50 nm for the simulation. The more lightly doped regions 44A, 45A have a height of 20 nm. The lengths of the more lightly doped regions 44A, 45A are about 30 nm each. Likewise, the lengths of the more heavily doped regions 44, 45 are about 30 nm.

A gate insulator 49 is disposed between gate 42 and the channel region 43. Also, the gate insulator 49 is disposed between the assist gate 46A and the assist gate 46B and the channel region 43.

For the simulation, the channel region has a p-type doping with a concentration of 1E15/cm3. The more lightly doped N− or P− regions 44A, 45A have a doping concentration of about 1E20/cm3 each. The more heavily doped N+ or P+ regions 44, 45 have a doping concentration of about 5E20/cm3.

The gate length $L_G$ is set at 32 nm. The assist gate lengths $L_{AG1}$ and $L_{AG2}$ are set at 50 nm. The length of the spacer between the gate and the assist gate is set at 5 nm. The gate insulator 49 has an effective oxide thickness of 1 nm for the purposes of the simulation. For the purposes of simulation, the gate is selected to have a mid-gap work function of 4.6 eV.

Figure 7:
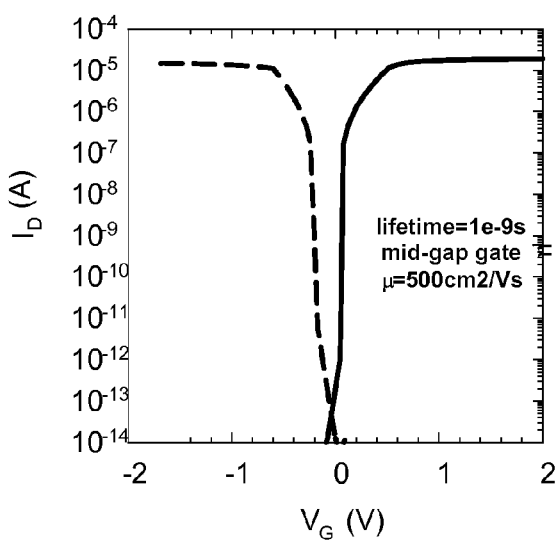
FIG. 7 is a graph of drain current on a logarithmic scale versus gate voltage for the transistor structure of FIG. 6, operating in a p-channel mode and in an n-channel mode.
Figure 8:
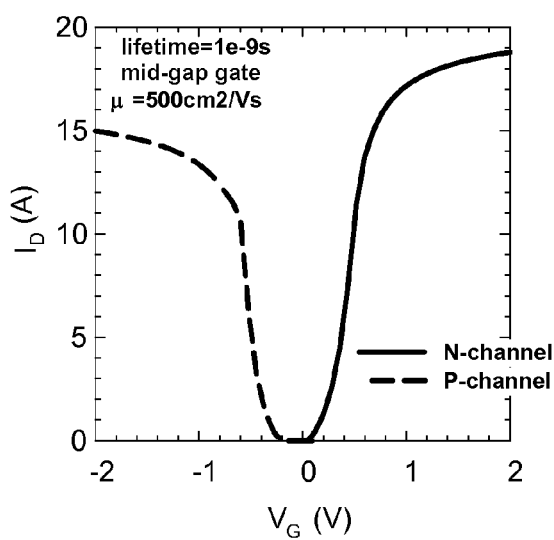
FIG. 8 is a graph of drain current on a linear scale versus gate voltage for the transistor structure of FIG. 6, operating in a p-channel mode and in an n-channel mode.

FIG. 7 is a graph of drain current (log scale) versus gate voltage (linear scale) showing simulation results for a p-channel mode (dashed line) and for an n-channel mode (solid line). FIG. 8 is a graph of drain current (linear scale) versus gate voltage (linear scale) also showing the simulation results. During the simulation, the bias conditions for n-channel read included a drain voltage on the p-type terminal of about +1.2 V, a source voltage on the n-type terminal of about 0 V, and an assist gate voltage of +2 V. The bias conditions for p-channel read included a drain voltage on the p-type terminal of about 0 V, a source voltage on the n-type terminal of about −1.2 V, and an assist gate voltage of −2 V. The graphs demonstrate ultralow leakage for both the n-channel and the p-channel read operations. As can be seen, the sub threshold slopes are less than 60 mV/decade, at gate voltages near 0 V for both modes. As a result, the structure can be utilized in low-power logic applications, other typically CMOS applications.

Thus, a dual-mode transistor structure is provided with excellent on/off characteristics, small leakage, and a super steep subthreshold slope. In addition, the simulation illustrates that each dual-mode finFET can provide drive current close to 20 µA. Assuming a fin pitch can be scaled below 20 nm, more than 50 fins can be provided in a one micron width layout area. The structure would enable greater than 1 mA per micron drive current for the dual-mode structure, which is comparable to state-of-the-art CMOS transistor structures.

On the other hand, the super steep subthreshold slope and very small leakage current can provide superior performance characteristics. The assist gate bias induces virtual source/drain terminals in the channel region which have relatively low carrier concentrations, and therefore much smaller leakage current than conventional N+ and P+ diffusion junctions.

Accordingly, a device having both a super steep subthreshold slope, and the ability to generate significant drive current, is provided.

One might explain operation of the dual-mode transistor structure with reference to a thyristor. Taking for example an n-channel read mode, with an assist gate greater than 0 V, the dual-mode transistor structure can be characterized as including five regions with respect to carrier concentration, with in order a P+ region provided by the first terminal region, an N− region induced by the first assist gate, a P− beneath the gate structure having a carrier concentration which is a strong function of gate voltage, an N− region induced by the second assist gate, and an N+ region provided by the second terminal region. Thus we have a P+/N−/P−/N−/N+ dynamic thyristor type structure. The p-type carrier concentration (P−) in the channel region is controlled by the gate voltage. If the gate voltage is too small or negative, the p-type carrier concentration can be relatively high making it hard to turn on the thyristor type structure. If the gate voltage however is increased, the p-type carrier concentration in the channel region is reduced, or nearly changed to an n-type carrier concentration. In this case, the thyristor mode can provide a positive feedback loop to amplify the current. This mode is highly sensitive to the gate voltage and the drain voltage. The feedback loop can break through the Boltzmann distribution factor of KT/q, thus providing the possibility of super steep subthreshold slope as demonstrated by the simulations.

As mentioned above, the dual-mode transistor structure can be dynamically changed utilizing the assist gates to a P+/P−/N−/P−/N+ dynamic thyristor type structure, for p-channel mode which preserves these thyristor type operational characteristics.

Thus, a dual-mode transistor structure is disclosed. The transistor structure includes a gate with a two-sided assist gate, separated by a thin sidewall spacer insulator. The assist gate bias can be applied in common to both sides, or the two sides can be separately biased for more flexible operation. Outside the assist gates, diffusion junctions for drain/source terminals are provided. One side is a relatively heavily doped, p-type terminal region, and the other side is a relatively heavily doped, n-type terminal region. In operation, when the assist gate is greater than 0 V, the selected gate controls an n-channel behavior of the device. When the assist gate is less than 0 V, the selected gate controls a p-channel behavior of the device. Both modes provide very good on/off characteristics with small leakage and a super steep subthreshold slope.

The dual-mode transistor structures enable new types of integrated circuit structures having configurable n-channel and p-channel operating modes.

Figure 9:
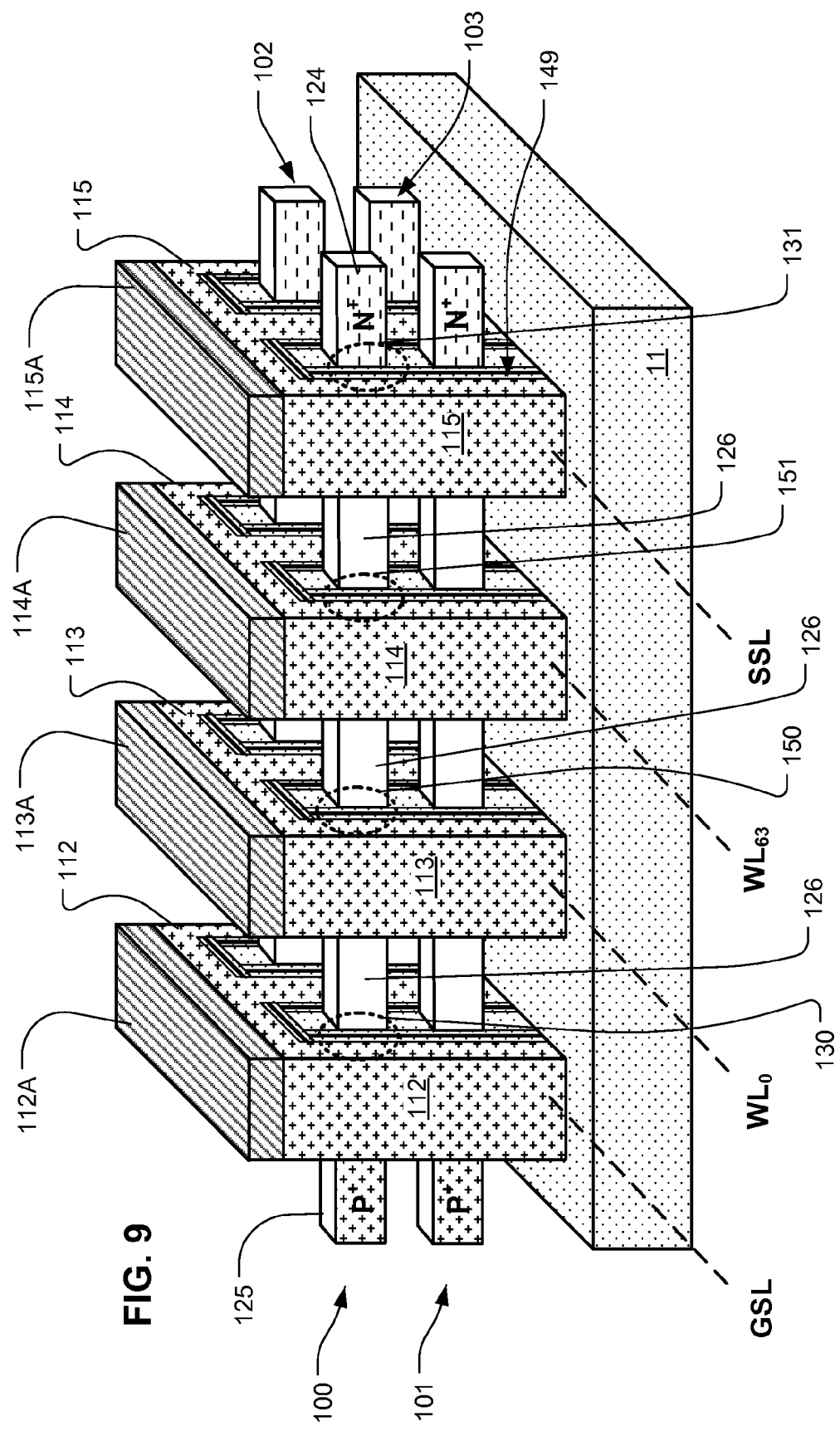
FIG. 9 illustrates a dual-mode, 3D vertical gate NAND memory structure.

FIG. 9 illustrates utilization of a dual-mode transistor-like structure in the implementation of a 3D memory device. The 3D memory device in this example includes a plurality of ridge-shaped stacks, in the form of multiple strips 100, 101, 102, 103 of semiconductor material separated by insulating material (removed for the purposes of the drawing between the word line structures). The strips 100-103 of semiconductor material each comprise a multi-gate channel region between a p-type terminal region (e.g. 125) on one end and an n-type terminal region (e.g. 124) on the other end. A plurality of conductive lines 112, 113, 114, 115 is arranged to cross over the stacks of strips. The regions 126 between the conductive lines 112, 113, 114, 115 are junction free, and can have the same doping profile, or a similar doping profile, as regions in the strips 100, 101, 102, 103 beneath the conductive lines. A dielectric charge storage structure 149 is disposed on the sidewalls of the stacks and at the cross points between the strips 100-103 and the conductive lines 112-115. A first conductive line 112, between the word lines and the p-type terminal regions in this example, is configured as a gate select line GSL. A last conductive line 115, between the word lines and the n-type terminal regions in this example, is configured as a string select line SSL. The conductive lines in between, of which only two (113, 114) are illustrated, are configured as word lines. In a representative embodiment, there may be for example 64 word lines crossing a single dual-mode, multi-gate strip.

In the illustration, a layer 112A, 113A, 114A, 115A of silicide or other material to assist conductivity is formed on a top surface of the conductive lines. The conductive lines also include vertical extensions between the stacks that form side gate structures for the dual-mode strings.

The charge storage structure 149 is disposed at least in the cross points in which memory cells are formed. The charge storage layer structure can comprise a multilayer dielectric charge storage structure, such as a SONOS-like structure. One dielectric charge storage structure which can be utilized is known as bandgap engineered SONOS, or "BE-SONOS." A BE-SONOS charge storage structure can include a multilayer tunneling layer, such as a layer of silicon oxide about 1 to 2 nm thick, a layer of silicon nitride about 2 to 3 nm thick and a layer of silicon oxide about 2 to 3 nm thick. A BE-SONOS structure includes a dielectric layer for storing charge on the multilayer tunneling layer, such as a layer of silicon nitride about 5 to 7 nm thick. Also, a BE-SONOS structure includes a dielectric blocking layer for blocking charge leakage on the charge storage layer, such as a layer of silicon oxide about 5 to 8 nm thick. Other materials may be utilized as well in the BE-SONOS stack.

As a result of this structure, memory cells (e.g. 150, 151) are formed in a 3D array in the cross points between the vertical extensions of the conductive lines 113, 114 and side surfaces of the multi-gate strips 100-103. A string select switch 131 and a ground select switch 130 are formed in the cross points between the vertical extensions of the conductive lines 115 and 112, respectively.

The structure can be configured so that the drain side of each of the dual-mode, multi-gate strips has an N+ type junction (terminal region 124) while the source side has a P+ type junction (terminal region 125). Inside the array, the channel regions of the strips are undoped or lightly doped, and junction free.

The memory cells along each of the strips 100-103 in this structure can be characterized as a dual-mode, multi-gate NAND string.

The p-channel and n-channel modes of operation of the channel can be controlled by the polarity of the pass gate voltages applied to unselected word lines (analogous to assist gates in the structure of FIG. 1), while a selected word line (analogous to the gate in the structure of FIG. 1) is controlled according to the selected operation, e.g. read, program or erase.

Figure 10:
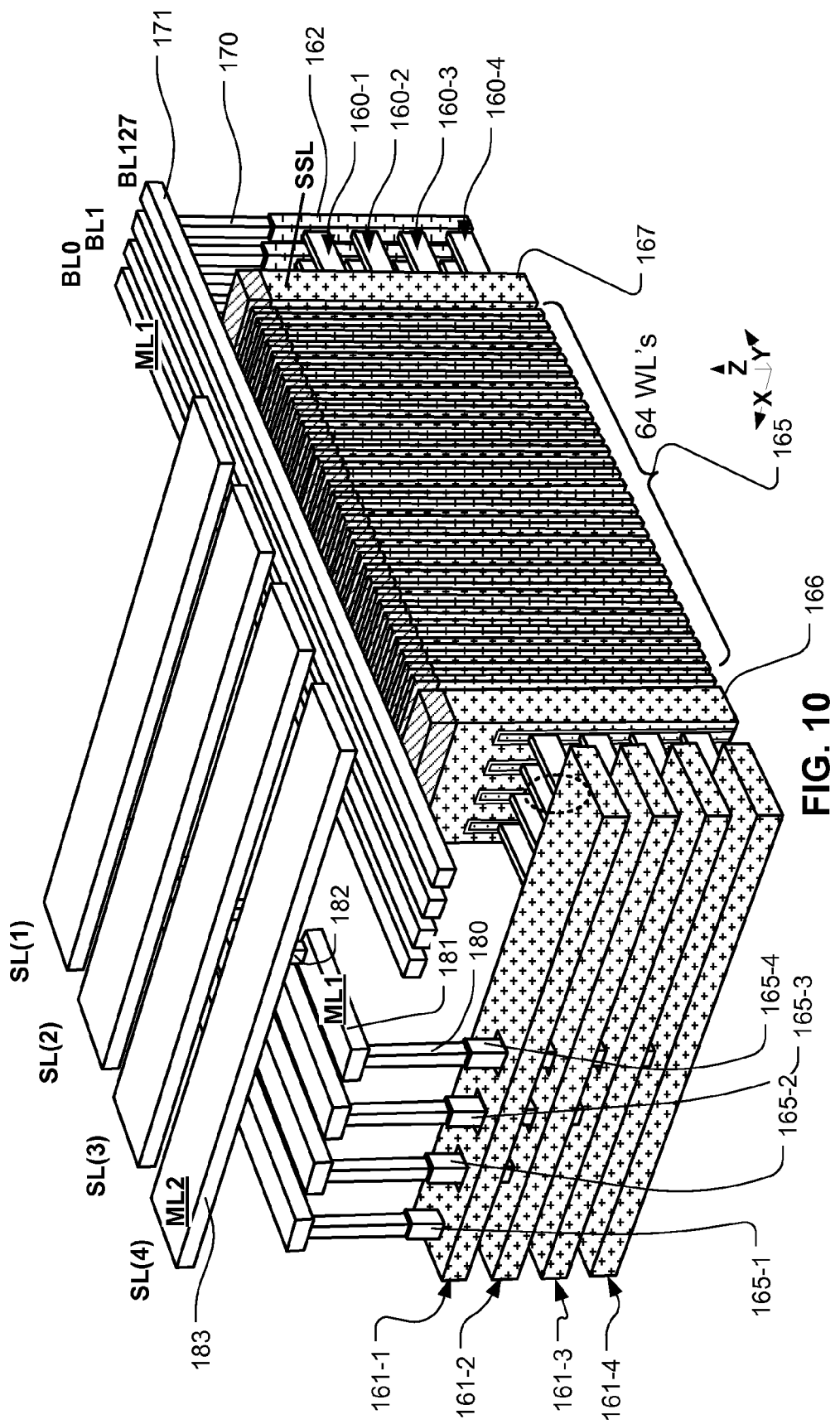
FIG. 10 illustrates decoding structures for use with an embodiment of a dual-mode, 3D vertical gate NAND memory structure.

An array architecture which can be utilized with the dual-mode, multi-gate strips shown in FIG. 9 is illustrated in FIG. 10. In the example shown in FIG. 10, there are four stacks, each including four semiconductor strips 160-1, 160-2, 160-3, 160-4. Each of the stacks of strips terminates in a vertical bit line plug (e.g. 162) at the SSL end of the strip. The vertical bit line plug (e.g. 162) can comprise the heavily doped n-type terminals for the dual-mode strips in its corresponding stack. In other examples, a heavily doped n-type terminal can be included in, or extend into, the end of the strip between the SSL line 167 and the vertical bit line plug 162. The vertical bit line plugs 162 are connected by interlayer connector 170 to a corresponding metal bit line (e.g. 171) in a first metal layer ML1. In one example, there can be for example 128 bit lines BL0 to BL127, in a given block of cells which are coupled to a corresponding 128 stacks of strips.

Each of the layers of strips, including one strip from each of a plurality of the stacks, terminates in a corresponding one of the plurality of horizontal source line pads 161-1, 161-2, 161-3, 161-4. The source line pads 161-1, 161-2, 161-3, 161-4 can comprise heavily doped p-type terminals for a plurality of the dual-mode strips in its corresponding layer. In other examples, heavily doped p-type terminals can be included in, or extend into, the end of the strip, between the GSL line 166 and the pad (e.g. 161-1). The source line pads 161-1, 161-2, 161-3, 161-4 can be configured to terminate a set of for example 16 or 32 of the strips in the corresponding layer. In some embodiments, each of the source line pads 161-1, 161-2, 161-3, 161-4 may terminate all of the strips in a given block.

The source line pads 161-1, 161-2, 161-3, 161-4 extend horizontally to a stairstep structure, at which each of the pads 161-1, 161-2, 161-3, 161-4 is coupled to a corresponding vertical plug 165-1, 165-2, 165-3, 165-4 which passes through vias in overlying pads up to plugs (e.g. 180) that reach to connectors (e.g. 181) in a first metal layer ML1. The source line connectors (e.g. 181) extend to inter-metal plugs (e.g. 182) to source lines (e.g. 183) SL(1), SL(2), SL(3), SL(4) in a second metal layer ML2.

As described with reference to FIG. 9, a plurality of conductive lines overlies the stacks of strips, forming a GSL line 166, a plurality of word lines 165 and an SSL line 167.

According to this array structure, an individual cell is selected by decoding a stack of strips (Y-dimension plane) using a bit line decoder, a layer of strips (Z-dimension plane) using a source line decoder, a slice of cells (X-dimension plane) using a word line decoder, and a block of cells using SSL and GSL decoders.

Another example of a 3D Vertical Gate (3DVG) architecture which can be modified as described herein to provide dual-mode channel regions, is described in U.S. Pat. No. 8,503,213 issued 6 Aug. 2013, entitled Memory Architecture Of 3D Array With Alternating Memory String Orientation And String Select Structures, by inventors Shih-Hung Chen and Hang-Ting Lue, which is incorporated by reference as if fully set forth herein.

In other embodiments, the horizontal strips can be configured as word lines, with vertical dual-mode structures between the strips for vertical channel NAND string configurations. See for example, commonly owned U.S. Pat. No. 8,363,476, issued 29 Jan. 2013 (filed 19 Jan. 2011), entitled Memory Device, Manufacturing Method And Operating Method Of The Same, by inventors Hang-Ting Lue and Shi-Hung Chen, which is incorporated by reference as if fully set forth herein.

FIGS. 11 and 12 are plan view diagrams of a dual-mode strip, configured as a NAND string, like the strips in the memory structure shown in FIGS. 9 and 10. In FIG. 11, the bias conditions for a source side read in an n-channel mode are illustrated. In FIG. 12, the bias conditions for a source side read in a p-channel mode are illustrated.

Referring to FIG. 11, the semiconductor strip 200 includes a channel region 205, disposed between a P+ terminal 205P and an N+ terminal 205N. A dielectric charge trapping layer 201A is disposed on one side of the strip 200, and a dielectric charge trapping layer 201B is disposed on the other side of the strip 200. The GSL switch is formed by the GSL dual gate structure adjacent the P+ terminal 205P. The SSL switch is formed by the SSL dual gate structure adjacent the N+ terminal 205N. The P+ terminal 205P and the N+ terminal 205N can overlap with the GSL and SSL dual gate structures, respectively, or be aligned as illustrated, as suits a particular implementation. The amount of overlap can have an effect on the character of the ambipolar operation, and on the amount of current in the devices.

The plurality of word lines forms two-sided gate structures G0 to G63, including a selected word line which forms gate structure Gn in the illustrated example. For n-channel read operations, as illustrated in FIG. 11, the GSL line, the unselected gate structures and the SSL line are biased with a read pass voltage greater than 0 V. As a result of the positive voltages on the unselected lines, electrons are induced into the channel region of the strip in the regions 207, 208 on both sides of the selected word line Gn, while the channel region 205 beneath the selected word line Gn remains under control of the bias on the selected word line, and its threshold voltage established by the charge trapped in the dielectric charge trapping structure.

For a read operation, the source side P+ terminal 205P receives positive voltages of about +2V sufficient to forward bias the PN junction between it and the region 207 of induced electrons in the channel region. The drain side N+ terminal 205N is biased at about 0 V to support flow of electrons into the channel region of the strip. In some embodiments, the drain side N+ terminal 205N is biased at about 0.3, or slightly positive to assist in suppressing leakage in unselected strips.

FIG. 12 is the same structure as shown in FIG. 11, and is given the same reference numerals. However, the bias arrangement illustrated in FIG. 12 induces a p-channel read mode. The source side and bit line side bias for p-channel read mode are the same as for n-channel read mode. However, the pass voltages and the GSL and SSL voltages are negative in order to induce a population of holes 210, 211 on both sides of the channel region 209 beneath the selected word line.

In FIG. 12, it can be seen that the word lines have a width W1, the GSL line has a width W2 and the SSL line has a width W3. It can be desirable that the width W2 of the GSL line and the width W3 of the SSL line be significantly greater than the width W1 of the word lines. For example, the widths W2 and W3 should be longer than the minority carrier diffusion lengths, while the widths of the word lines need not be as wide. In one example the widths W2 and W3 can be about 0.35μ, while the word line widths are on the order of 20 to 50 nm.

The structure of FIG. 11 can be operated without memory structures. As such, the structure is a circuit comprising a semiconductor strip including a channel region, a p-type terminal region adjacent a first side of the channel region and an n-type terminal region adjacent a second side of the channel region; a plurality of gates arranged in series along the semiconductor strip in the channel region; a first reference line coupled to a first end of the semiconductor strip and a second reference line coupled to a second end of the semiconductor strip. Circuitry can be coupled to the first and second reference lines, configured to selectively bias the channel region for n-channel mode or for p-channel mode.

Figure 13:
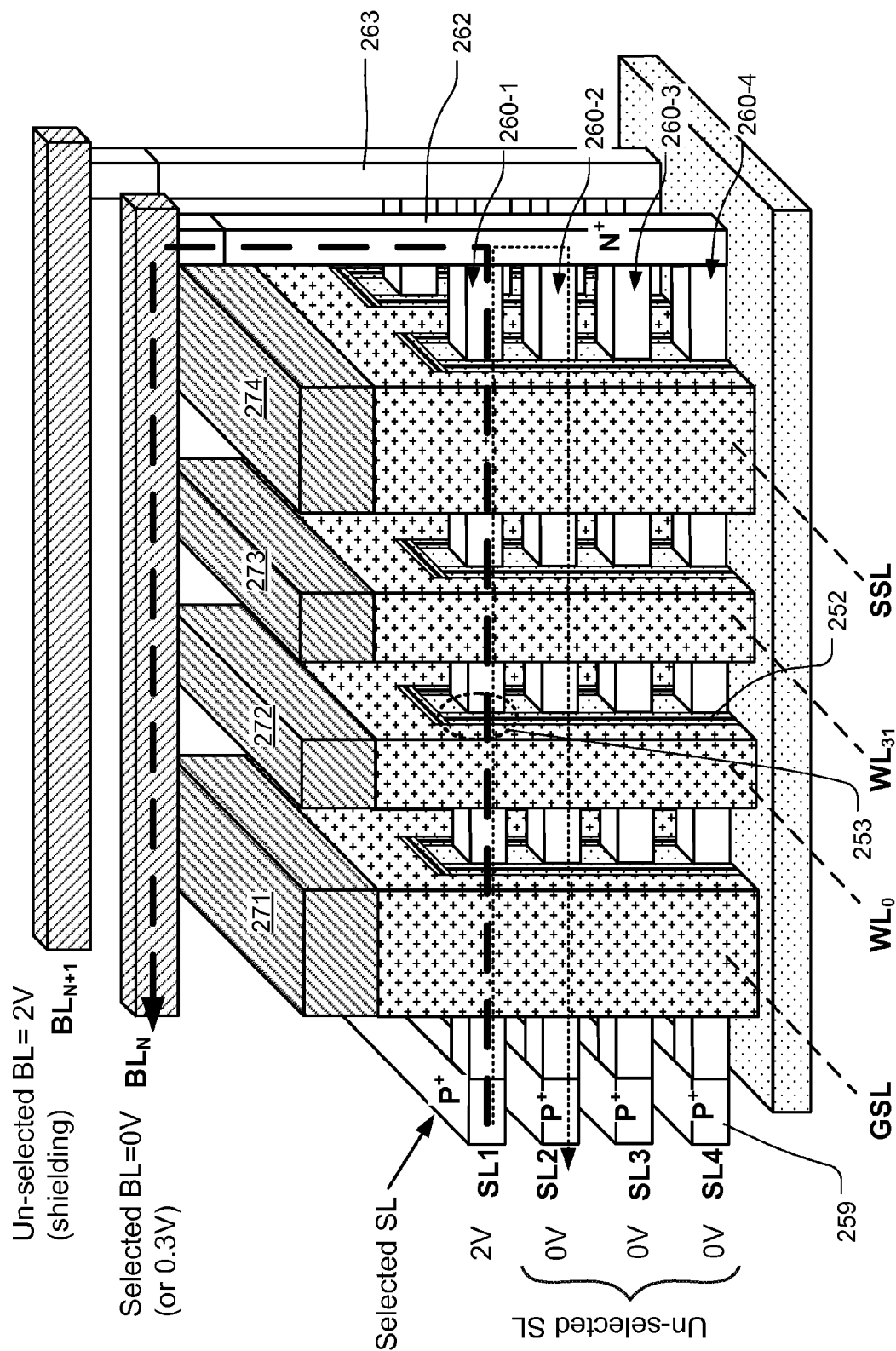
FIG. 13 illustrates a dual-mode channel, 3D vertical gate NAND memory structure biased for source-side sensing for a read operation.

FIG. 13 shows a portion of an array that includes a plurality of dual-mode strips configured as NAND strings, for the purposes of illustrating current paths during a read operation. Thus, the structure includes a plurality of stacks of dual-mode strips 260-1, 260-2, 260-3, 260-4. The strips in each of the stacks is terminated in a corresponding N+ vertical bit line plug 262, 263 on one end. The strips in each layer are terminated in a corresponding P+ horizontal source line pad (e.g. 259). Dielectric charge trapping structure 252 overlies the stacks of strips. As a result, memory cells (e.g. 253) are formed at the cross points with the word lines 272, 273. GSL line 271 and SSL line 274 are used for controlling operation of the NAND strings.

For a read operation as illustrated, the unselected source lines are biased at about 0 V. The selected source line is biased at about positive 2 volts. The selected bit line is biased at about 0 V or about 0.3 V. The unselected bit lines are biased at about positive 2 volts. As a result of the bias, the strip 260-1 is selected for read. The memory cell 253 in the target strip can be selected by a word line 272. The PN junction at the selected source line pad is forward biased by the positive 2 volts on the source line and about 0 V (or 0.3 V) on the drain side of the strip. Current flow in the unselected strips in the stack that terminate in the same vertical bit line plug 262 is blocked by the 0 V or 0.3 V bias on the unselected source lines, which can prevent forward bias or maintain a slight reverse bias of the PN junction. Current flow in the unselected strips in the layer that terminates in the selected source line is blocked by the positive 2 V bias on unselected bit lines, which prevents current flow through the PN junction on the source line end.

Thus, source side sensing is used in order to take advantage of the PN junction coupled to the source side. If sufficient source bias (greater than about 1.5 V) is applied to maintain a forward bias on the PN junction, the stray current path to unselected source lines is eliminated by the PN junction due to the very low leakage current in the reversed direction on this junction. A slightly positive bit line bias (such as about 0.3 V) on the selected bit line may be implemented to minimize stray currents, by causing a slight reverse bias on the PN junctions in unselected source lines.

Figure 14:
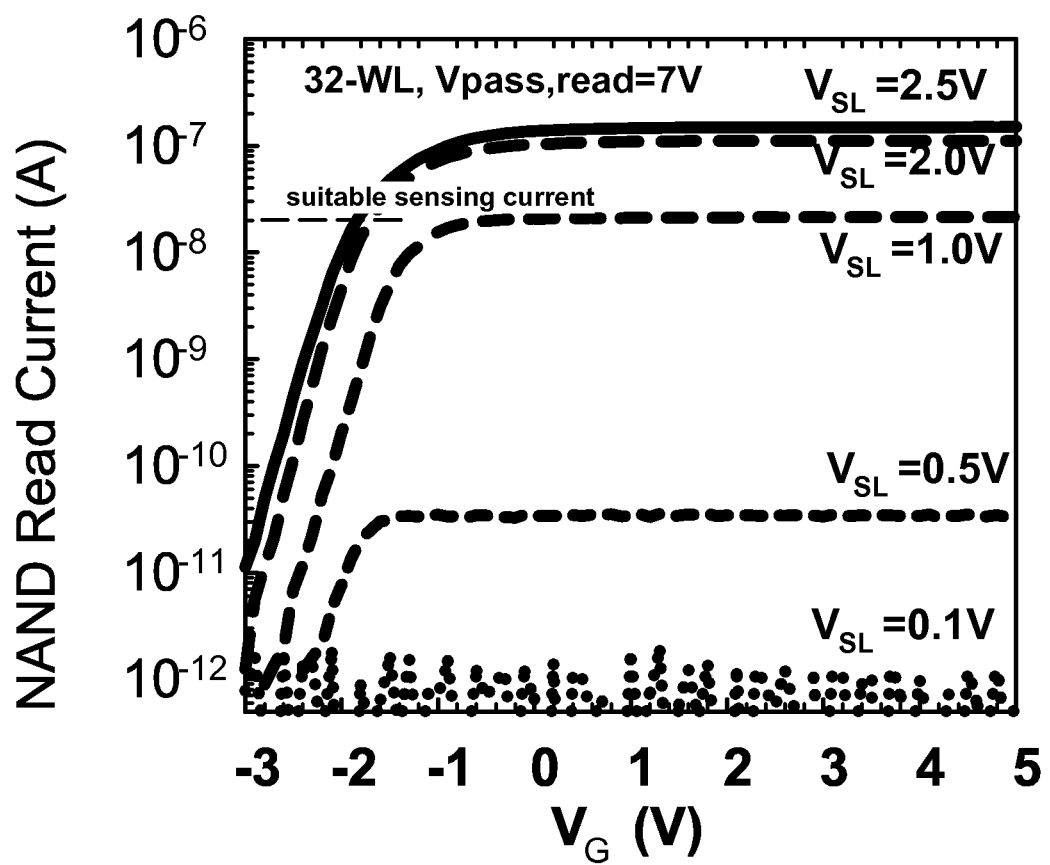
FIG. 14 a graph of read current versus gate voltage as a function of source line voltage in the memory structure shown in FIG. 13.

FIG. 14 is a graph showing read current versus gate voltage during a source side read for various source line voltages ranging from about 0.1 V to about 2.5 V. The level of suitable sensing current is labeled in the figure around 100 microamps. Thus it is shown that a source line voltage greater than about 1.5 V is sufficient to achieve suitable sensing current for source side read.

Figure 15:
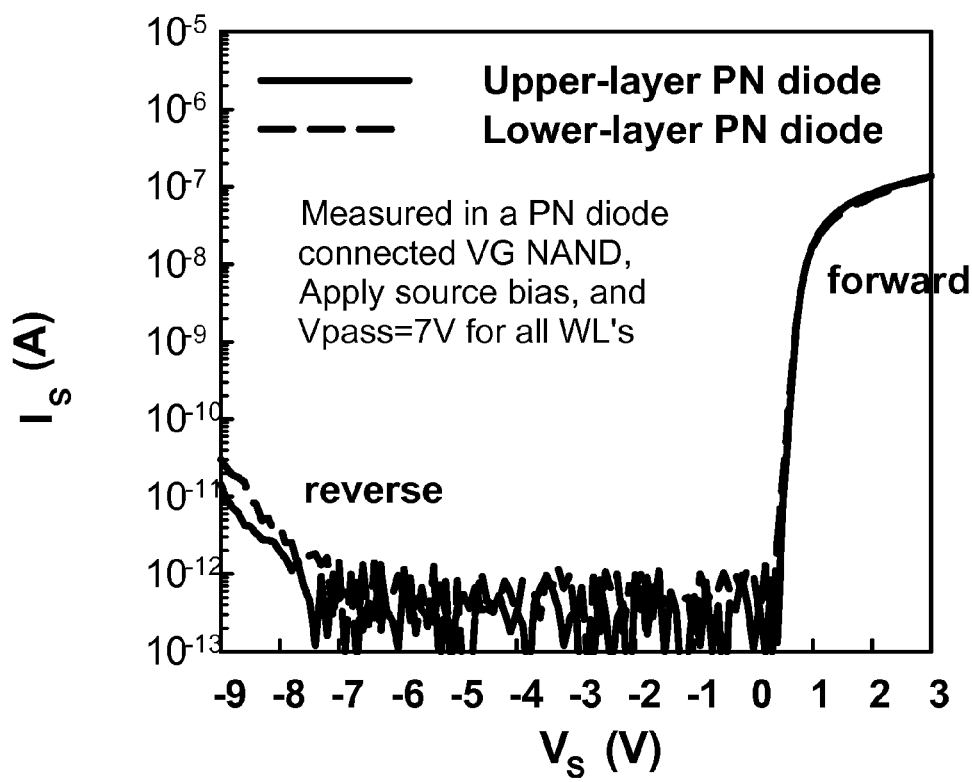
FIG. 15 is a graph of source current versus source voltage showing characteristics of a PN junction on the source side of the memory structure shown in FIG. 13.

The PN junction on the source line pad strip interface can be implemented using a polysilicon diode. FIG. 15 is a graph showing polysilicon diode characteristics. It can be seen that for negative source voltage as low as about −8 V, leakage current is below one picoAmp. Breakdown of the junction occurs around −10 V. Turn on voltage is about 0.8 V for the structure. Saturated current through the NAND string occurs around 1.5 V positive bias, and has a relatively linear slope. Thus, excellent on/off characteristics of the PN junction are illustrated. Also, the reverse leakage current at a negative 8 V bias is very small, supporting successful program and read operations.

Figure 16:
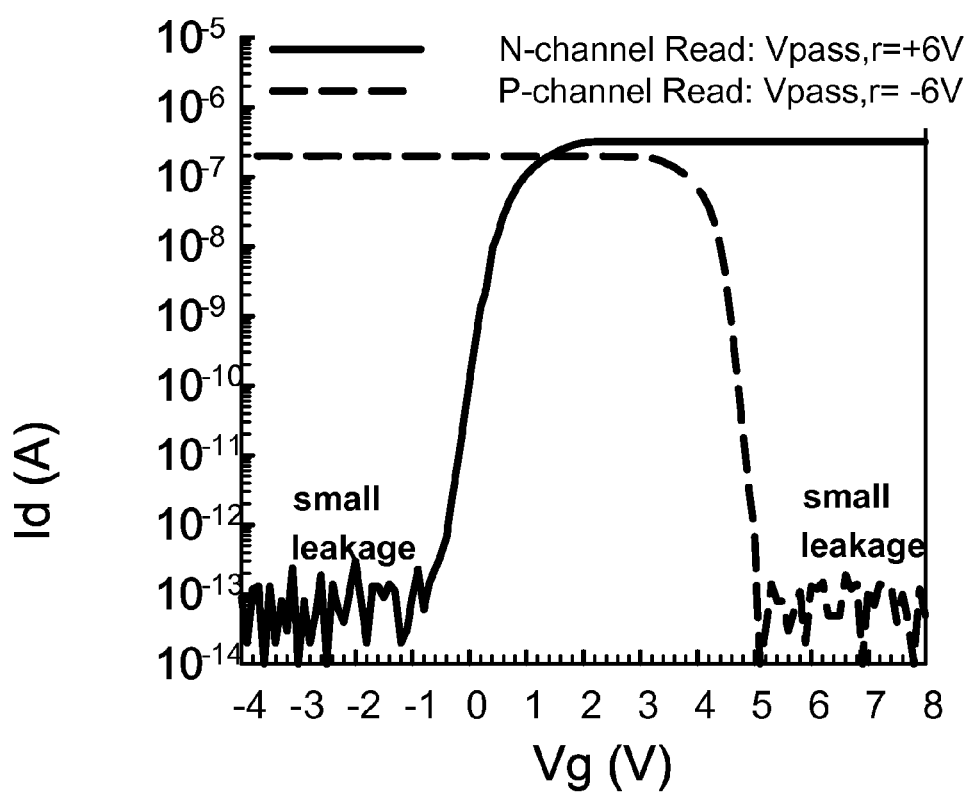
FIG. 16 is a graph of drain current versus gate voltage for n-channel read and p-channel read operations on the NAND string in the memory structure of FIG. 13.

FIG. 16 is a graph of experimental data of measured drain current versus gate voltage for a selected memory cell in the center word line of a structure like that shown in FIG. 13.

The n-channel mode read characteristics are shown in the solid line, induced using pass voltages of about positive 6 V. The p-channel mode read characteristics are shown in the dashed line, induced using pass voltages of about negative 6 V. Both modes demonstrate very small leakage current and suitable drive current.

Figure 17:
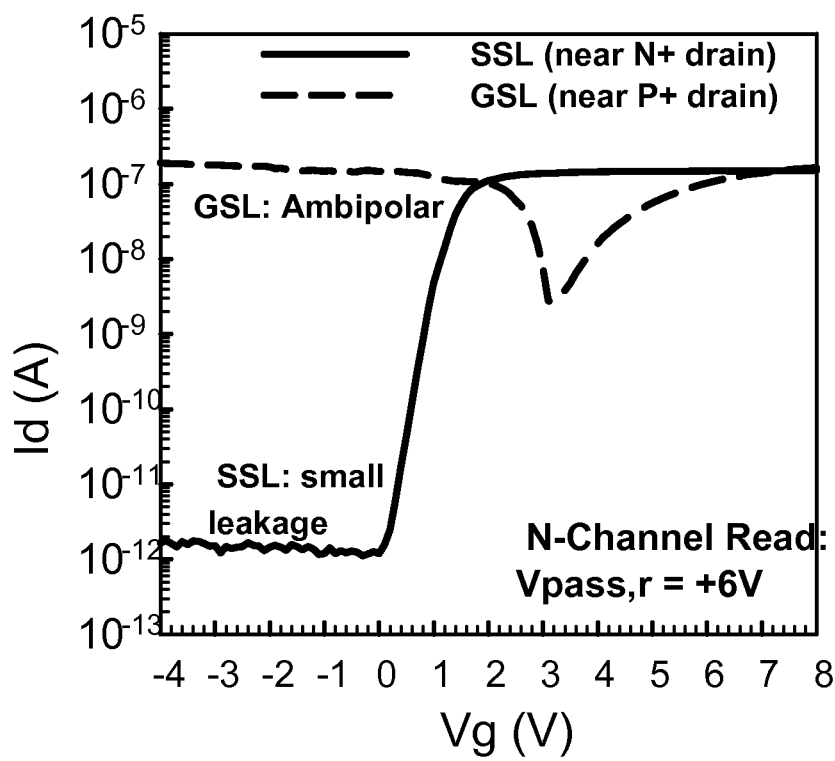
FIG. 17 is a graph of drain current versus gate voltage for the ground select line and string select line gates for n-channel mode read in the memory structure shown in FIG. 13.

FIG. 17 is a graph of the performance of the GSL switch (near P+ source) shown with dashed lines, and the SSL switch (near N+ drain) shown with solid lines, during an n-channel mode read with pass voltages of positive 6 V. This illustrates for n-channel read that the SSL switch has a very small leakage current, while the GSL switch is completely ambipolar and cannot be turned off in this operating mode.

Figure 18:
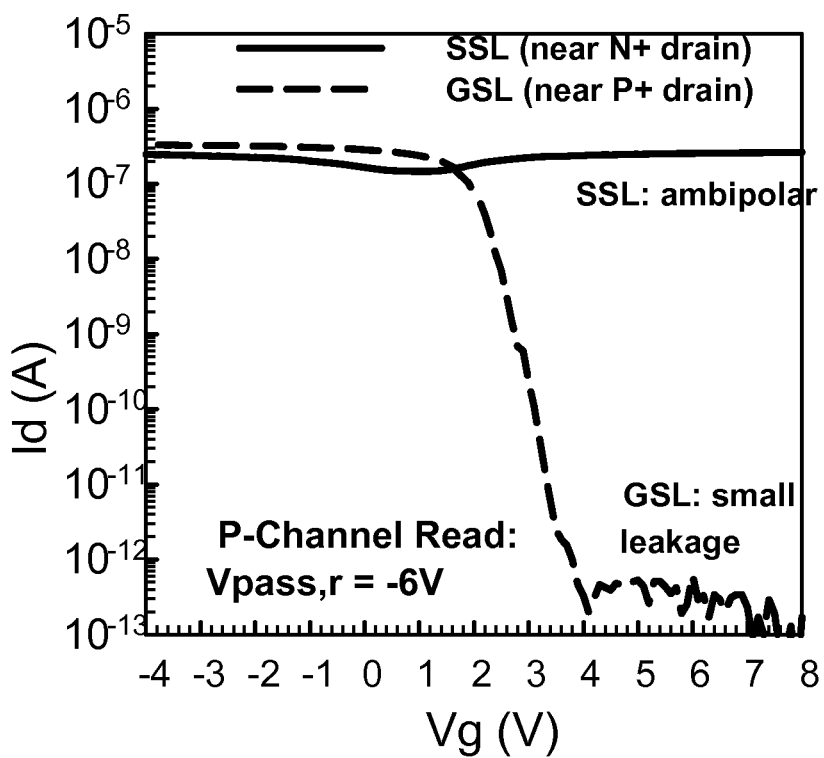
FIG. 18 is a graph of drain current versus gate voltage for the ground select line and string select line gates for p-channel mode read in the memory structure shown in FIG. 13.

FIG. 18 is a graph of the performance of the GSL switch (near P+ source) shown with dashed lines, and the SSL switch (near N+ drain) shown with solid lines, during a p-channel mode read with pass voltages of negative 6 V. For p-channel read, the GSL device has a very small leakage current, while the SSL device is completely ambipolar.

Figure 19:
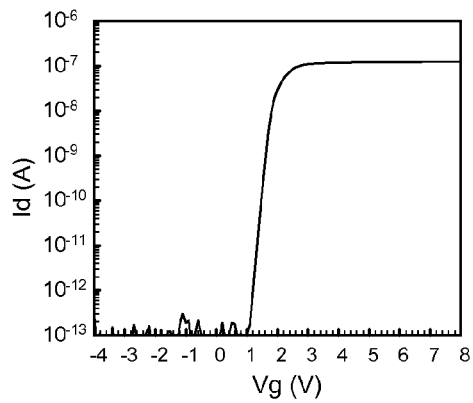
FIGS. 19-22 are graphs of drain current versus gate voltage for memory cells on the first word line WL0, and on the last word line WL63 in a memory structure like that shown in FIG. 13, for n-channel mode and p-channel mode reads.
Figure 20:
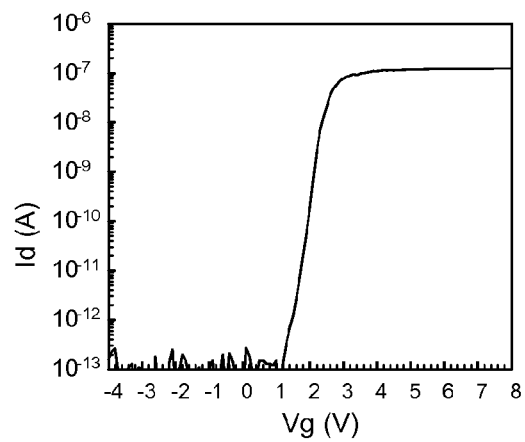
Figure 21:
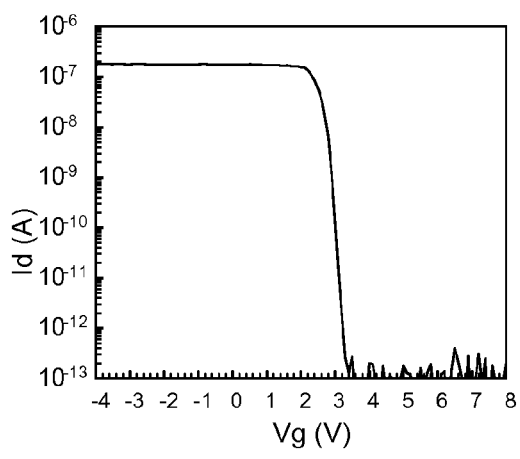
Figure 22:
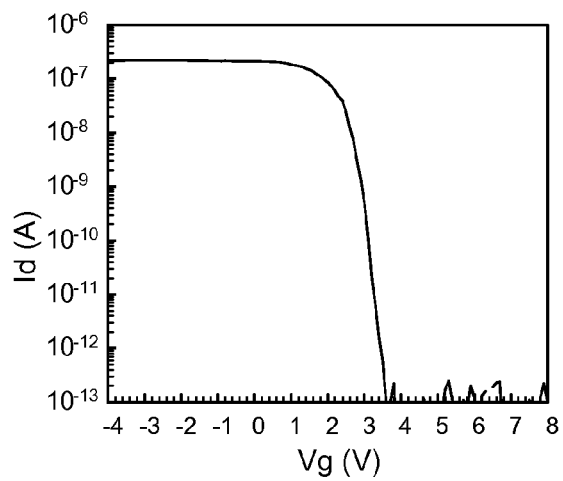

FIGS. 19-22 illustrate the switching behavior for memory cells on the edge of the array. FIG. 19 illustrates performance of a memory cell on word line WL0 during n-channel read. FIG. 20 illustrates performance of a memory cell on word line WL63 during n-channel read. FIG. 21 illustrates performance of a memory cell on word line WL0 during p-channel read, and FIG. 22 illustrate performance of a memory cell on word line WL63 during p-channel read. This demonstrates that in the experimental structure, the edge word lines function correctly. This suggests that the minority carrier diffusion length is much smaller than the channel length of the SSL and GSL switches, preventing ambipolar behavior on the edge word lines.

Figure 23:
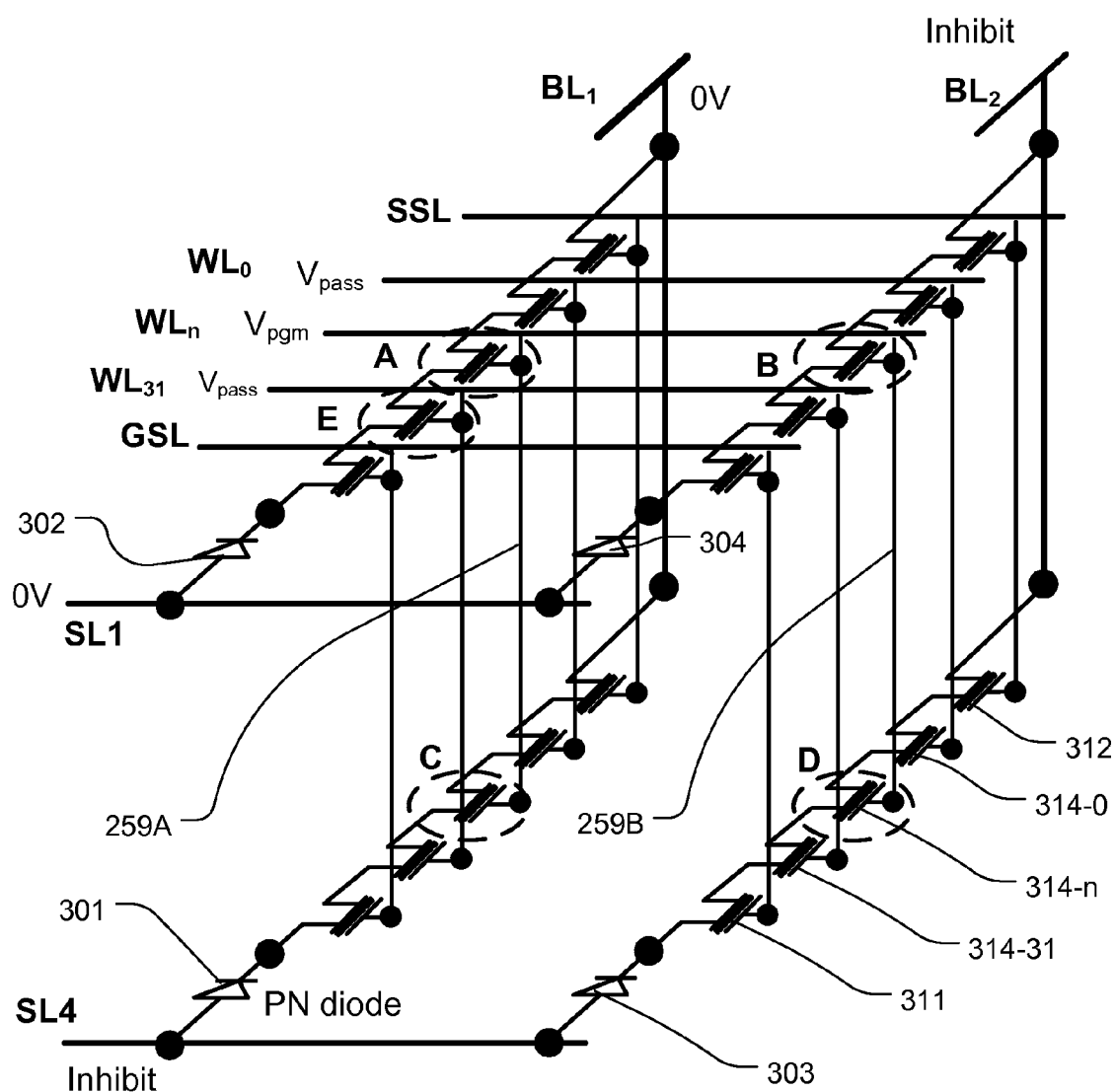
FIG. 23 is a schematic circuit diagram of a dual-mode, 3D memory structure.

FIG. 23 is a schematic circuit diagram showing four NAND strings of the structure of FIG. 13. In the diagram, a horizontal source line SL1 and a horizontal source line SL4 are illustrated, each coupled to a pair of NAND strings in respective layers by PN diodes 301, 302, 303, 304. Also, vertical bit lines BL1 and BL2 are each connected to a stack of NAND strings. The PN diodes correspond to the PN junction on the source side of the strings as illustrated in FIG. 13. Referring to a representative string which is coupled to the source line SL4 and the bit line BL2, each string includes a GSL switch 311, a string of memory cells 314-0, . . . 314-n, . . . 314-31 (for a 32 cell string embodiment) and an SSL switch 312.

Reference to FIG. 23 is made in the description of program and erase operations where a target cell is labeled cell A. Neighboring cells B-E are discussed for the purposes of understanding program and erase disturb conditions. The target cell A is coupled to word line WLn, having vertical extensions 259A and 259B. Thus cells B, C, D are all coupled to the same word line as the target cell A and receive the word line program pulse during programming and the word line erase pulse during erasing. Cell B is on the same word line and the same source line. Neighbor cell E is on the same NAND string as the target cell A but on a different word line.

As illustrated in the diagram, during a program pulse for target cell A, the selected bit line BL1 receives a bias of about 0 V, and the unselected bit line BL2 sees an inhibit voltage. Likewise, the selected source line SL1 receives a bias of about 0 V, and the unselected source line SL4 receives an inhibit bias. The selected word line WLn receives the program pulse, while the unselected word lines received the pass voltages.

Figure 24:
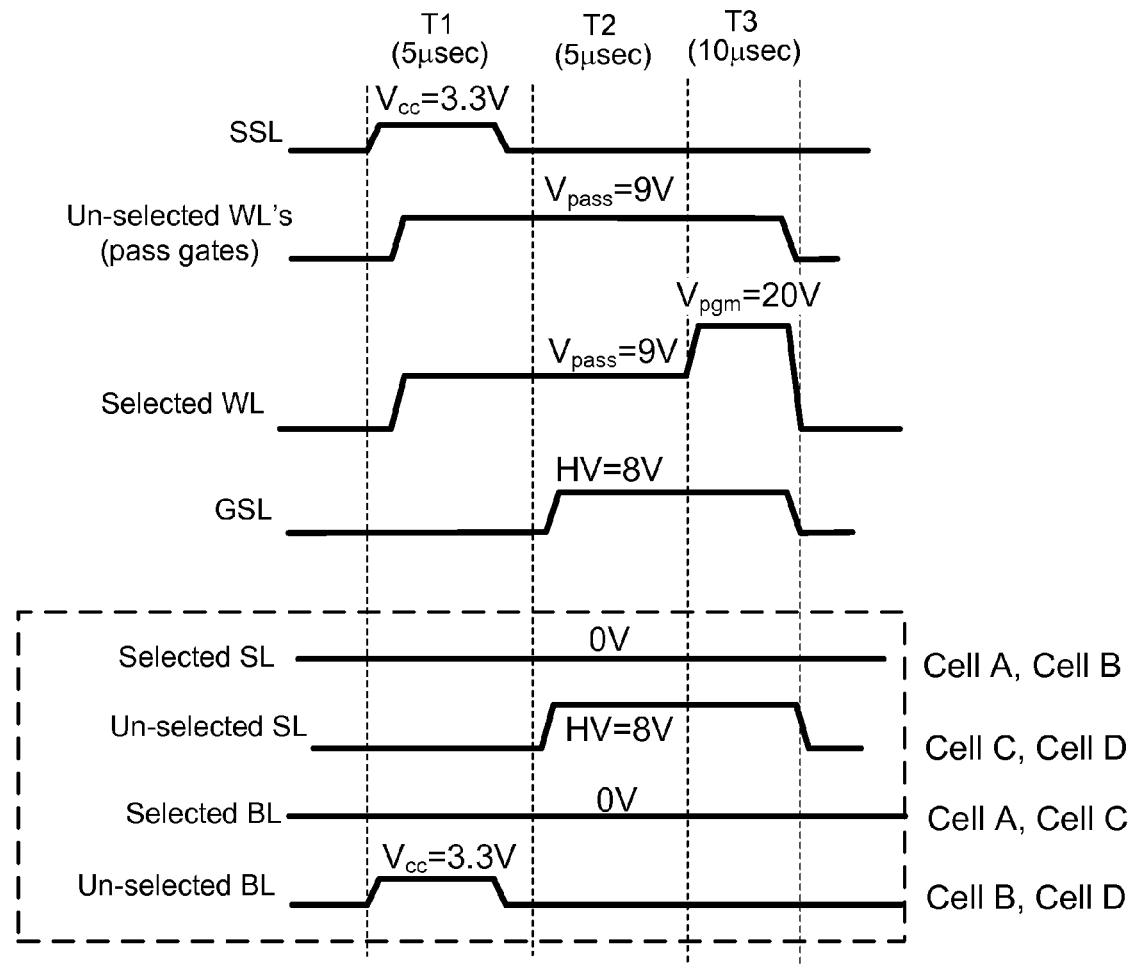
FIG. 24 is a timing diagram for a programming operation suitable for use with the dual-mode memory structure as described herein.

FIG. 24 is a timing diagram for a programming operation which is executed in three phases according to this embodiment.

At the beginning of phase T1, voltage on the SSL switch and the unselected bit lines transition to about 3.3 V (e.g. Vcc). The selected bit line remains at about 0 V, as do the unselected word lines, selected word line, GSL switch and unselected source line. This enables current flow in the strings coupled to the selected bit line, while blocking current flow in the strings coupled to the unselected bit line. A short time thereafter, word line voltages on unselected word lines and selected word lines are shifted to a pass voltage of for example positive 9 V, which causes boosting of the isolated channels of cells B and D. At the end of phase T1, the SSL switch and the unselected bit line are returned to about 0 V, while the word line voltages remain at the pass voltage level. In one example, phase T1 can last about 5 µs.

In phase T2, the GSL signal and the unselected source line signals are raised to a high voltage of about positive 8 V, while the word line voltages remain at the pass voltage level about 9 V. This causes the unselected source line biased to increase for inhibit, while the boosted channel potential of cell B does not leak due to the PN diode. These bias voltages remain steady at the end of phase T2. In one example, phase T2 can last about 5 µs.

In phase T3, the voltage on the selected word line is boosted to the program potential of about 20 V (program pulse). During phase T3, cell A is programmed. The inversion channel of electrons providing a carrier source for the program operation is formed during phase T1. At the end of phase T3, the voltages can return to the 0 V level. In one example, phase T3 can last about 10 µs.

Cell E is on the selected bit line, and receives the pass voltage in this configuration. The pass voltage level should be less than that required for programming the cell. For example, the pass voltage can be 9 V is this programming bias arrangement, while the program voltage is about 20 V. As a result, cell E should suffer negligible disturbance during the program operation for cell A.

The programming operation illustrated in FIG. 24 can be executed in an incremental step pulse sequence, where the program voltage is increased for each step in the sequence to cause incremental shifts in the threshold voltage of the target cell.

Figure 25:
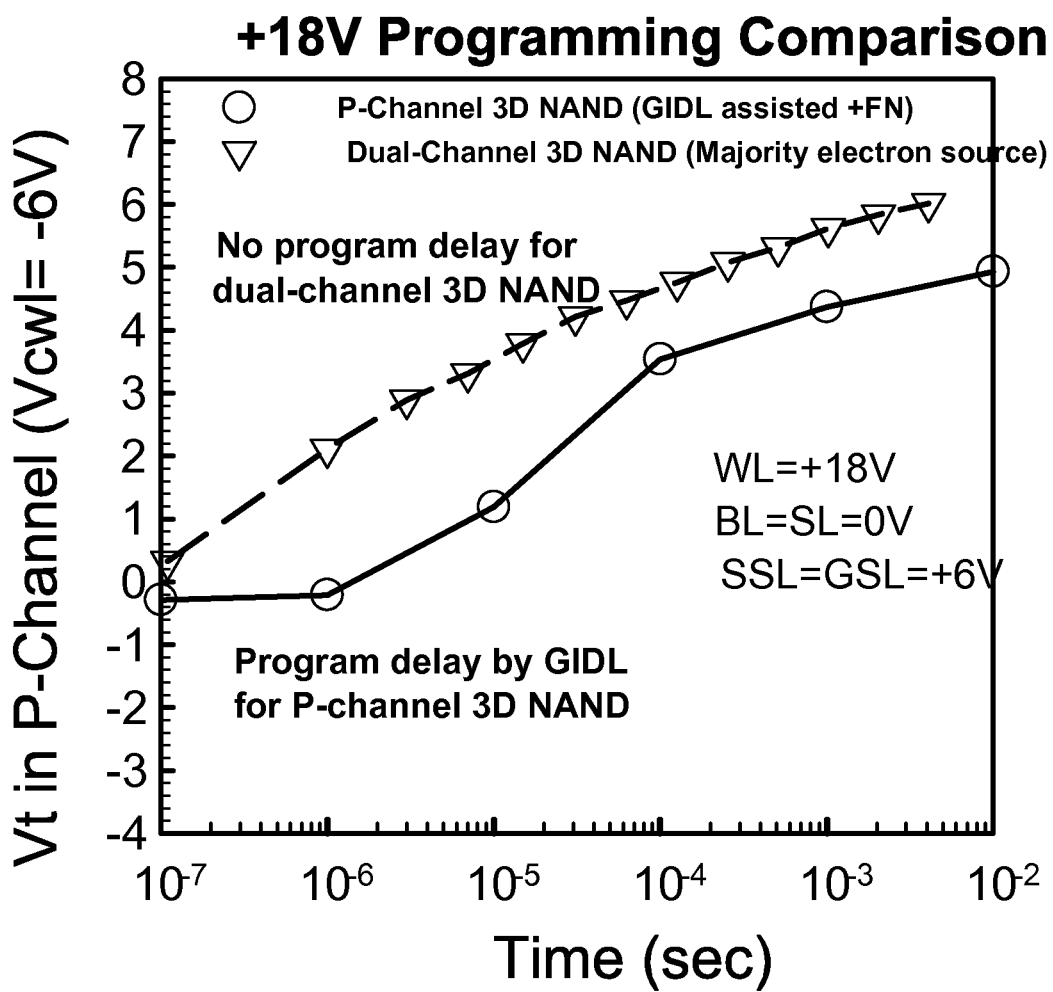
FIG. 25 is a graph of threshold voltage versus time, comparing programming operations using positive gate voltage Fowler-Nordheim tunneling in the dual-mode structure described herein, and in an n-channel structure relying on gate induced drain leakage current.

FIG. 25 is a graph showing threshold voltage versus time for a program operation as applied to a p-channel 3D NAND which relies on gate induced drain leakage GIDL to assist +FN tunneling programming (positive FN programming), and the dual-mode structure as shown in FIG. 13. As can be seen, programming begins immediately for the dual-mode structure, and can complete more quickly. This may be a result of the fact that the generation of electrons by gate-induced drain leakage in the p-channel 3D NAND takes a relatively long period of time.

Figure 26:
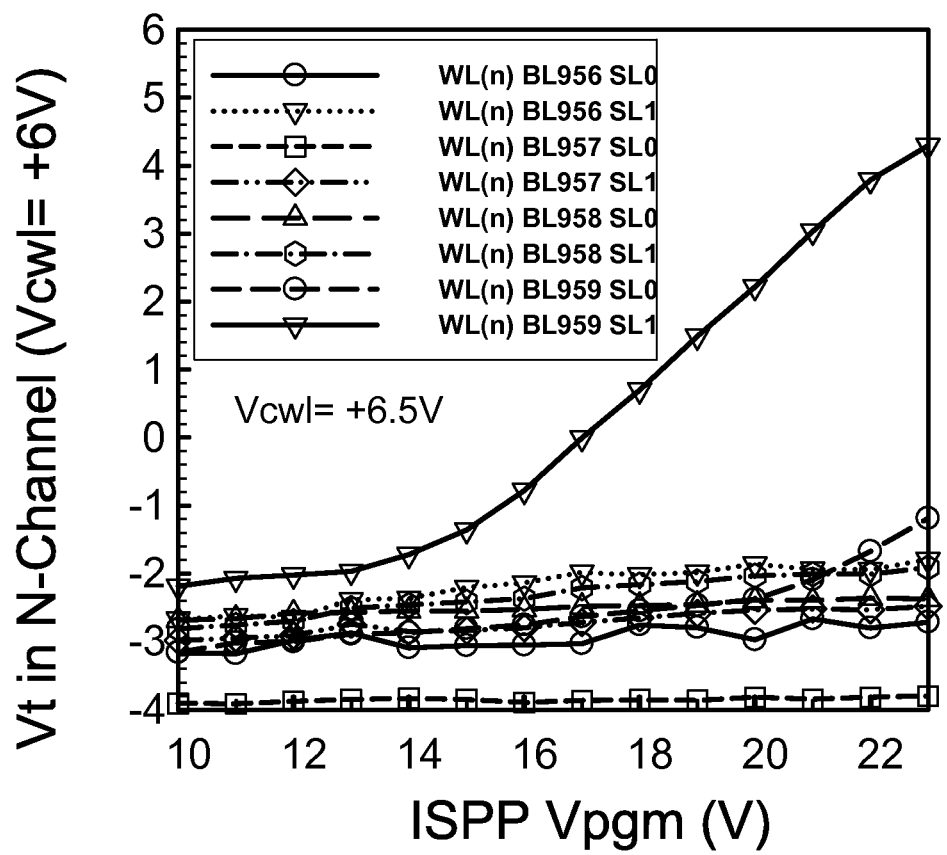
FIG. 26 is a graph of threshold voltage versus program voltage for an incremental step pulse programming ISPP operation, illustrating programming performance for an operation like that of FIG. 24.

FIG. 26 is a graph showing the results of incremental step pulsed programming applying a programming operation like that of FIG. 24, in an incremental pulse manner. The graph shows threshold voltage in the n-channel mode, and demonstrates that a target cell can be successfully programmed with suitable margin, while threshold increase is successfully inhibited in unselected cells.

Figure 27:
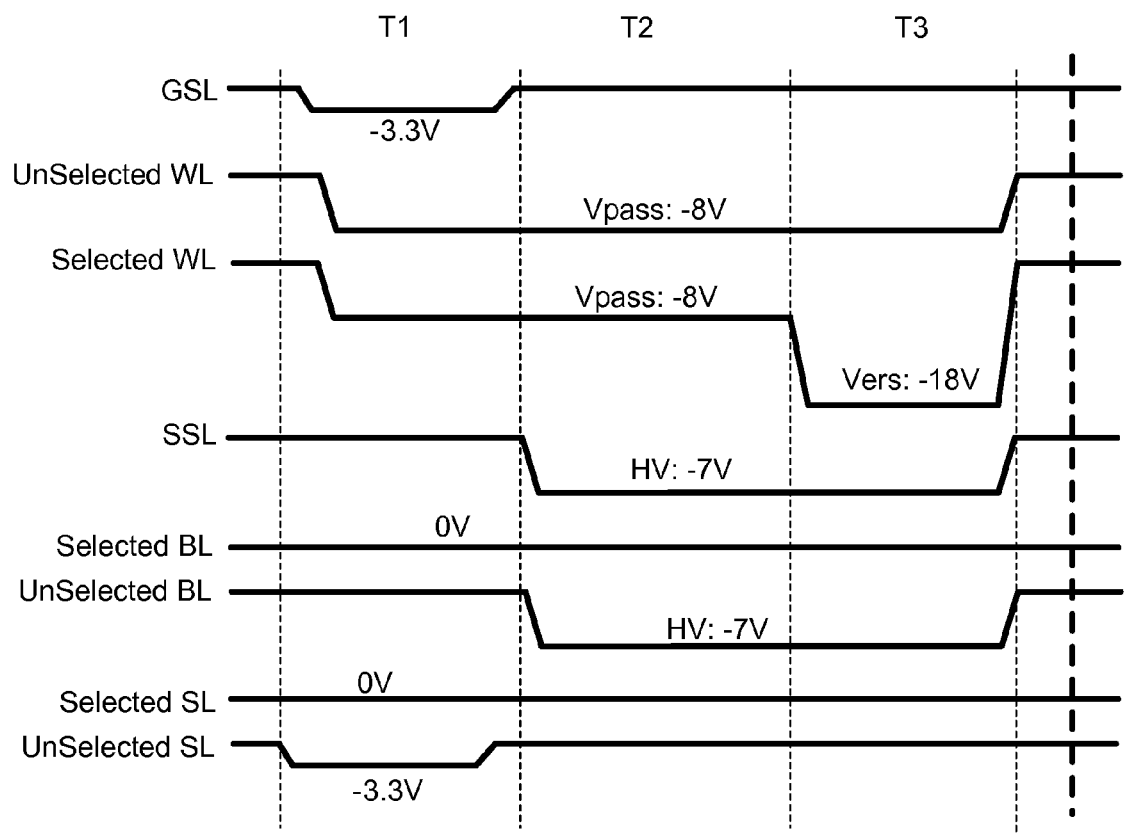
FIG. 27 is a timing diagram for an erasing operation suitable for use with the dual-mode memory structure as described herein.

FIG. 27 shows a timing diagram for −FN erase of a selected cell, including three intervals, T1, T2 and T3.

At the beginning of phase T1, voltage on the GSL switch and the unselected bit lines transition to about −3.3 V (e.g. negative Vcc). The selected bit line remains at about 0 V, as do the unselected word lines, selected word line, GSL switch and unselected source line. This enables current flow in the strings coupled to the selected source line, while blocking current flow in the strings coupled to the unselected source line. A short time thereafter, word line voltages on unselected word lines and selected word lines are shifted to a pass voltage of for example negative 8 V, which causes boosting of the isolated channels of cells B and D. At the end of phase T1, the GSL switch and the unselected source line are returned to about 0 V, while the word line voltages remain at the pass voltage level. In one example, phase T1 can last about 5 µs.

In phase T2, the SSL signal and the unselected bit line signals transition to about negative 7 V, while the word line voltages remain at the pass voltage level about negative 8 V. This causes the unselected bit line bias to lower for inhibit, while the boosted channel potential of cell B does not leak due to the PN diode. These bias voltages remain steady at the end of phase T2. In one example, phase T2 can last about 5 µs.

In phase T3, the voltage on the selected word line transitions to the erase potential of about negative 18 V (erase pulse). During phase T3, cell A is erased. The inversion channel of holes providing a carrier source for the erase operation is formed during phase T1. At the end of phase T3, the voltages can return to the 0 V level. In one example, phase T3 can last about 10 µs.

The erase waveform is similar to the program waveform conceptually. However, the polarity is inversed and the roles between the SSL and GSL, and between the bit line and the source line are reversed.

Figure 28:
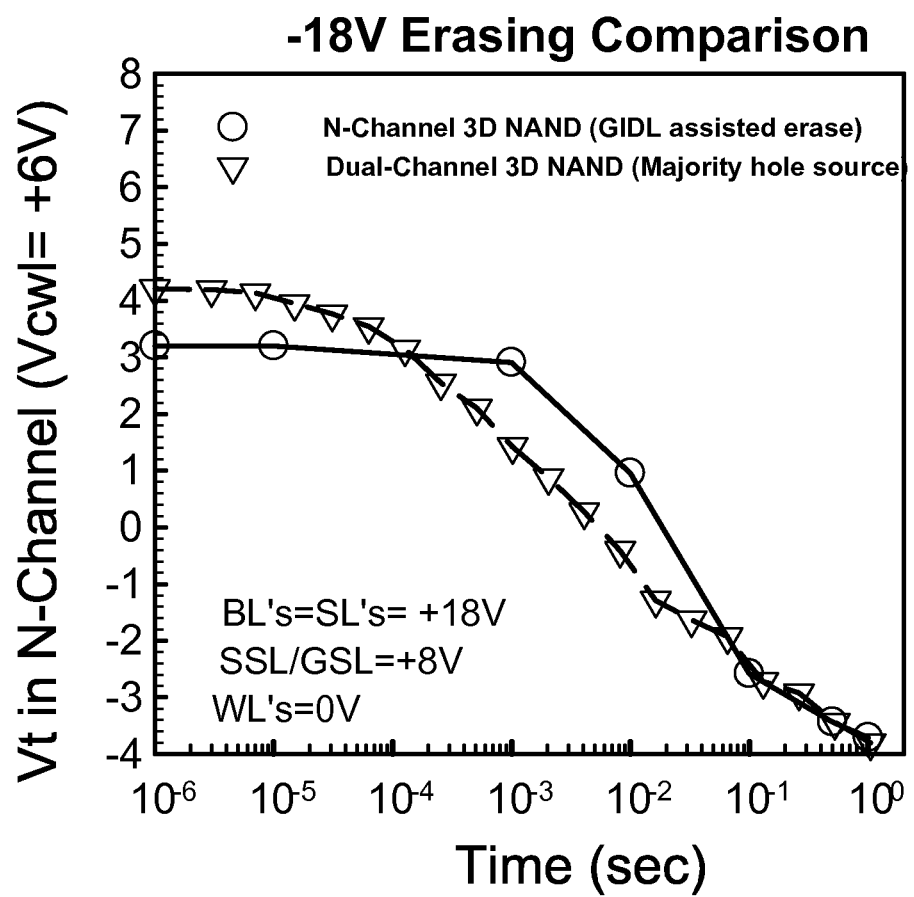
FIG. 28 is a graph of threshold voltage versus time, comparing erase operations using negative gate voltage Fowler-Nordheim tunneling in the dual-mode structure described herein, and in an n-channel structure of the prior art.

FIG. 28 is a graph showing threshold voltage versus time for an erase operation as applied to a p-channel 3D NAND which relies on gate-induced drain leakage GIDL to assist −FN tunneling erasing (negative FN erasing), and the dual-mode structure as shown in FIG. 13. As can be seen, erasing begins immediately for the dual-mode structure, and can complete more quickly. This may be a result of the fact that the reliance on gate-induced drain leakage for generation of holes in the n-channel 3D NAND takes a relatively long period of time.

Figure 29:
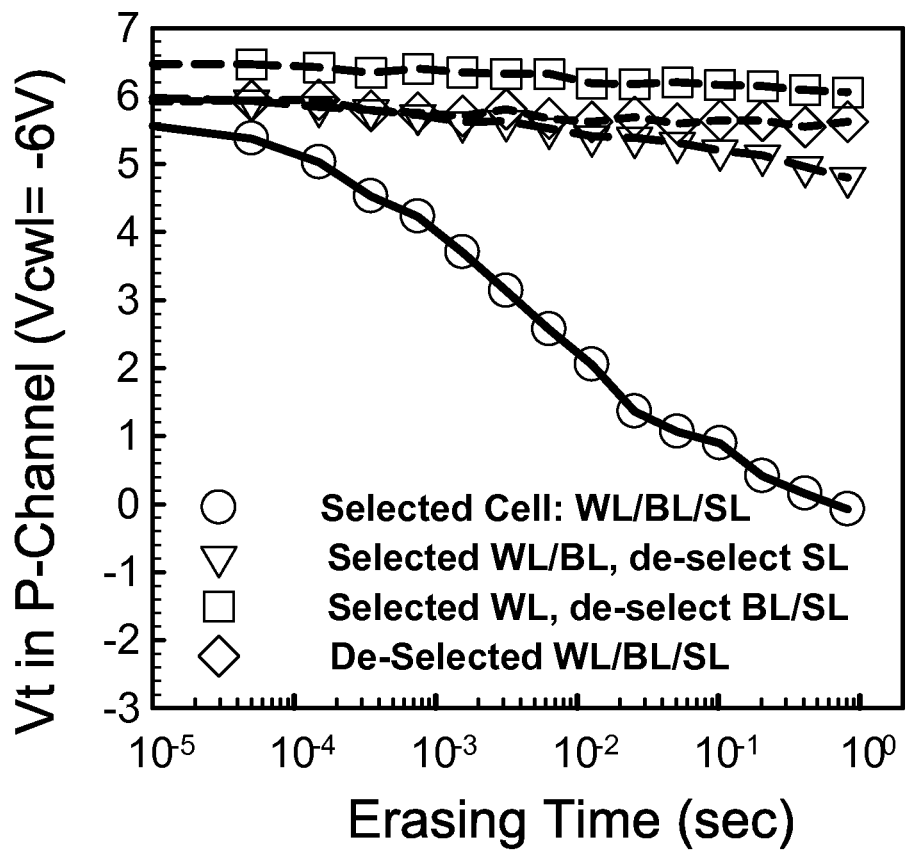
FIG. 29 is a graph of threshold voltage versus erasing time, illustrating erasing performance for an operation like that of FIG. 27.

FIG. 29 is a graph of threshold voltage versus erasing time demonstrating performance of erase inhibit. As illustrated, a selected cell can be successfully erased, while threshold drop in unselected cells is successfully inhibited.

Figure 30:
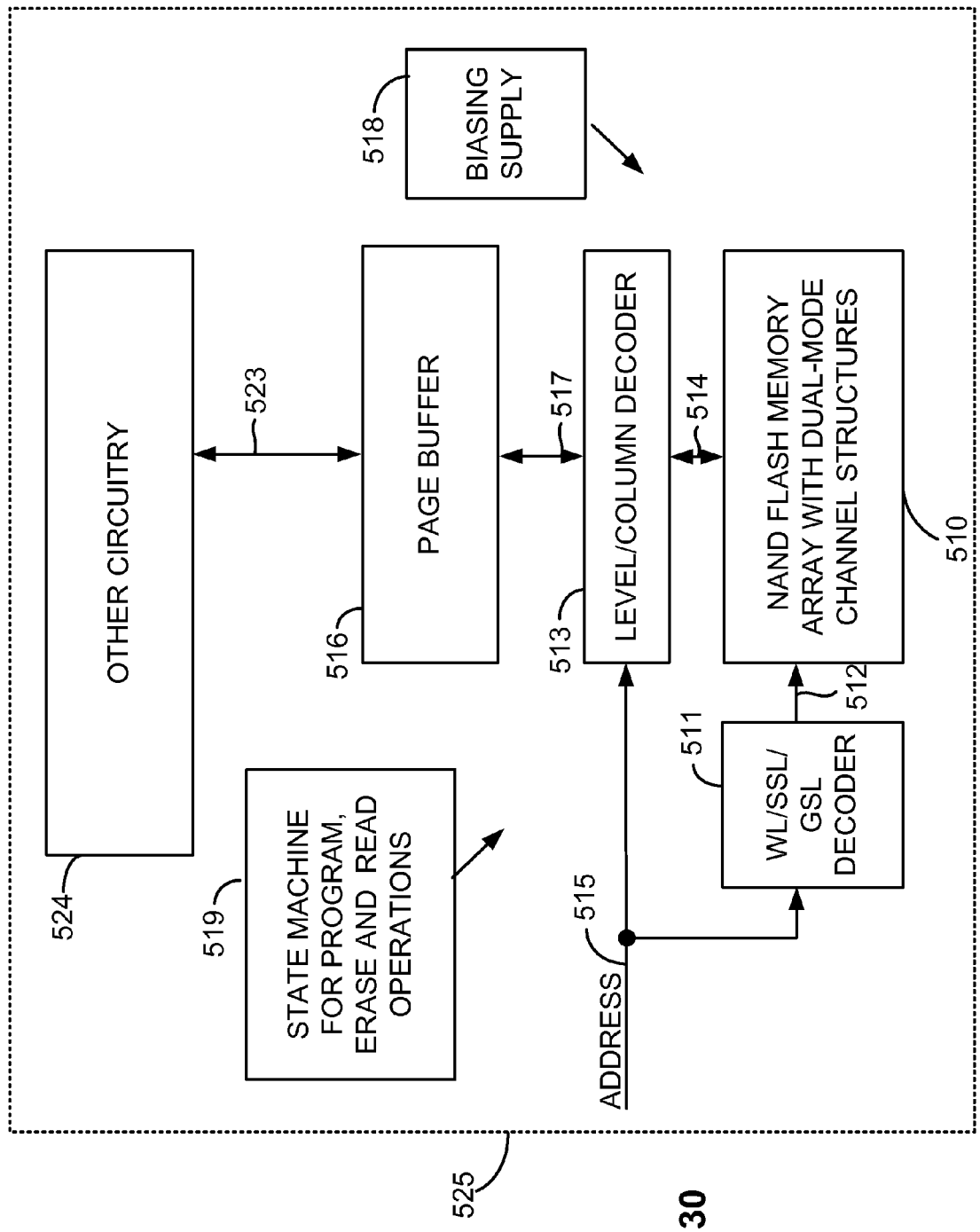
FIG. 30 is a simplified block diagram of an integrated circuit including flash memory utilizing dual-mode structures as described herein.

FIG. 30 is a simplified block diagram of an integrated circuit 525 including a dual-mode, NAND flash memory array 510 which can be operated as described herein. In some embodiments, the array 510 is a 3D memory and includes multiple levels of cells. A row decoder 511 is coupled to a plurality of word lines, string select lines and ground select lines (512) in the memory array 510. A level/column decoder in block 513 is coupled to a set of page buffers 516, in this example via data bus 517, and to the global bit lines and source lines 514. Addresses are supplied on bus 515 to level/column decoder (block 513) and row decoder (block 511). Data is supplied via the data-in line 523 from other circuitry 524 (including for example input/output ports) on the integrated circuit, such as a general purpose processor or special purpose application circuitry, or a combination of modules providing system-on-a-chip functionality supported by the array 510. Data is supplied via the data-in line 523 to input/output ports or to other data destinations internal or external to the integrated circuit 525.

A controller, implemented in this example as a state machine 519, provides signals to control the application of bias arrangement supply voltages generated or provided through the voltage supply or supplies in block 518 to carry out the various operations described herein, including dual-mode operations to read and write data in the array. These operations include erase, program and read as discussed in more detail above. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller. The circuitry of the integrated circuit is configured to execute an erase operation for a single selected cell in a selected semiconductor strip, and a program operation for a single selected cell in a selected semiconductor strip. Thus, both "bit erase" and "bit program" are used in the example described.

Figure 31:
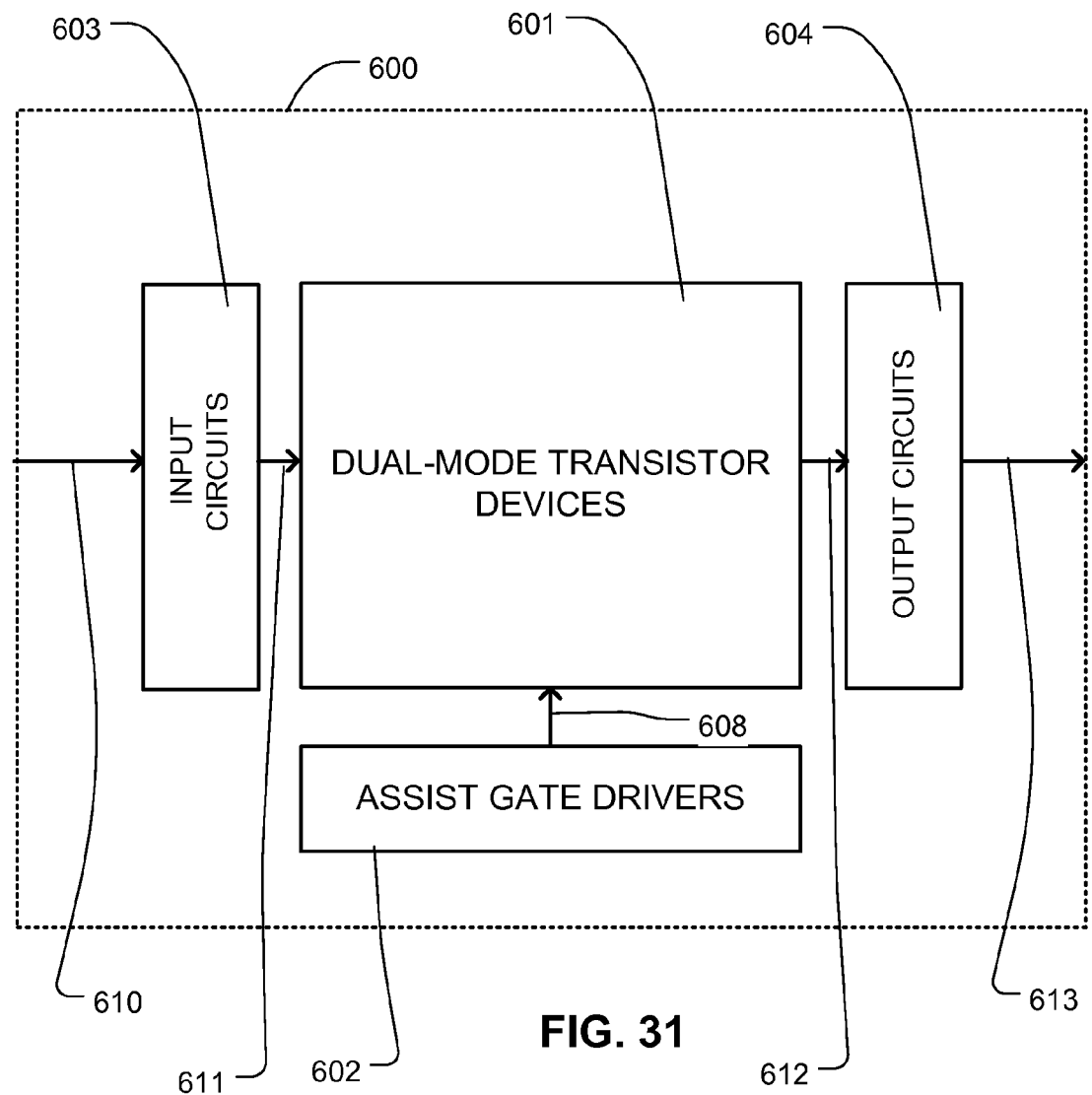
FIG. 31 is a simplified block diagram of an integrated circuit including circuitry that comprises a plurality of dual-mode transistor structures.

FIG. 31 is a simplified block diagram of an integrated circuit 600 that deploys dual-mode transistor devices as described herein. On the integrated circuit 600 there is an array 601 of dual-mode transistor devices such as illustrated in FIG. 4 and FIG. 5. Input signals can be delivered to the integrated circuit 600 on line 610, at input circuitry 603. The input circuitry 603 can deliver signals on line 611 to the dual-mode transistor devices in the array 601. These signals on line 611 can be connected to the gates of dual-mode transistor structures for example. Also, the device can include assist gate driver 602, which delivers signals on line 608 to the array 601 of dual-mode transistor devices, where the mode of the cells is set for n-channel mode or p-channel mode. Output signals received on line 612 from the array 601 of dual-mode transistor devices are applied to output circuits 604. Output signals can be delivered off the integrated circuit on line 613.

The assist gates on the dual-mode transistor devices can also be controlled by input signals on line 611, and by the outputs of other dual-mode transistor devices.

A method of operating a circuit like that represented by FIG. 31, comprising a plurality of transistor structures including respective first and second assist gates disposed on opposing sides of a gate, is described which comprises supplying positive voltages to the first and second assist gates of some of the plurality of transistor structures; and supplying negative voltages to the first and second assist gates of others of the plurality of transistor structures. Also, the method can include operating said some of the plurality of transistor structures as n-channel transistors; and operating said others of the plurality of transistor structures as p-channel transistors. In some embodiments, the method can include applying a back gate bias to at least one transistor structure in the plurality.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device comprising:
   a transistor including a semiconductor body including a channel region, a p-type source/drain terminal region adjacent a first side of the channel region and an n-type source/drain terminal region adjacent a second side of the channel region;
   a gate insulator on a surface of the semiconductor body over the channel region;
   a gate on the gate insulator over the channel region;
   a first assist gate on the gate insulator disposed on a first side of the gate overlying a portion of the channel region adjacent the p-type source/drain terminal region, and a second assist gate on the gate insulator disposed on a second side of the gate overlying a portion of the channel region adjacent the n-type source/drain terminal region; and
   an assist gate driver electrically connected to the first and second assist gates to apply bias voltages to the first and second assist gates, configured to switch the transistor between an n-channel mode in which the bias voltages are positive and a p-channel mode in which the bias voltages are negative.

2. The device of claim 1, including an insulating layer on a substrate, and wherein the semiconductor body is disposed on and isolated from the substrate by the insulating layer.

3. The device of claim 2, including a conductor in the insulating layer beneath the semiconductor body configured as a back gate underlying the channel region.

4. The device of claim 1, wherein the first assist gate is electrically connected to the second assist gate.

5. The device of claim 1, wherein the semiconductor body comprises a plurality of fins in the channel region.

6. A device comprising:
   a plurality of transistor structures, transistor structures in the plurality including respectively:
      a semiconductor body including a channel region, a p-type source/drain terminal region adjacent a first side of the channel region and an n-type source/drain terminal region adjacent a second side of the channel region;
      a gate insulator on a surface of the semiconductor body over the channel region;
      a gate on the gate insulator over the channel region; and
      a first assist gate on the gate insulator disposed on a first side of the gate overlying a portion of the channel region adjacent the p-type source/drain terminal region, and a second assist gate on the gate insulator disposed on a second side of the gate overlying a portion of the channel region adjacent the n-type source/drain terminal region; and
   an assist gate driver coupled to the assist gates in the plurality of transistor structures which applies positive voltages to the first and second assist gates of some of the transistor structures to induce n-channel operation of the transistor structure, and negative voltages to the first and second assist gates of others of the transistor structures to induce p-channel operation of the transistor structure.

7. The device of claim 6, including an insulating layer on a substrate, and wherein the semiconductor bodies of the plurality of transistor structures are disposed on and isolated from the substrate by the insulating layer.

8. The device of claim 7, including conductors in the insulating layer beneath the semiconductor bodies configured as back gates underlying the channel regions of transistor structures in the plurality.

9. The device of claim 8, including circuitry coupled to the conductors which applies voltages to the conductors to control threshold voltages of transistor structures in the plurality.

10. The device of claim 6, wherein in at least one of the transistor structures in the plurality, the first assist gate is electrically connected to the second assist gate.

11. The device of claim 6, wherein a first transistor structure in the plurality is electrically connected to a second transistor structure in the plurality, and the assist gate driver coupled to the assist gates applies a positive voltage to the first and second assist gates of the first transistor structure, and applies a negative voltage to the first and second assist gates of the second transistor structure.

12. A method of manufacturing a dual-mode transistor device comprising:
   forming a semiconductor body including a channel region, a p-type source/drain terminal region adjacent a first side of the channel region and an n-type source/drain terminal region adjacent a second side of the channel region;
   forming a gate insulator on a surface of the semiconductor body over the channel region;
   forming a gate on the gate insulator over the channel region; and
   forming a first assist gate on the gate insulator disposed on a first side of the gate overlying a portion of the channel region adjacent the p-type source/drain terminal region, and a second assist gate on the gate insulator disposed on a second side of the gate overlying a portion of the channel region adjacent the n-type source/drain terminal region; and
   providing an assist gate driver electrically connected to the first and second assist gates to apply bias voltages to the first and second assist gates, configured to switch the transistor between an n-channel mode in which the bias voltages are positive and a p-channel mode in which the bias voltages are negative.

13. The method of claim 12, including forming the semiconductor body on an insulating layer on a substrate, and wherein the semiconductor body is isolated from the substrate by the insulating layer.

14. The method of claim 13, including forming a back gate underlying the channel region in the insulating layer.

15. The method of claim 12, including forming the first assist gate electrically connected to the second assist gate.

16. The method of claim 12, including patterning a plurality of fins in the channel region of the semiconductor body.

* * * * *